United States Patent
Yamaji et al.

(10) Patent No.: US 12,063,035 B2
(45) Date of Patent: Aug. 13, 2024

(54) SUPERCONDUCTING QUANTUM CIRCUIT APPARATUS AND CONTROL METHOD FOR A SUPER CONDUCTING QUANTUM CIRCUIT

(71) Applicant: NEC Corporation, Tokyo (JP)

(72) Inventors: Tomohiro Yamaji, Tokyo (JP); Aiko Yamaguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 101 days.

(21) Appl. No.: 17/986,031

(22) Filed: Nov. 14, 2022

(65) Prior Publication Data
US 2023/0163762 A1 May 25, 2023

(30) Foreign Application Priority Data
Nov. 22, 2021 (JP) .................................. 2021-189597

(51) Int. Cl.
| | |
|---|---|
| H03K 17/92 | (2006.01) |
| G06N 10/20 | (2022.01) |
| H03B 27/00 | (2006.01) |
| H03H 11/16 | (2006.01) |

(52) U.S. Cl.
CPC ............. *H03K 17/92* (2013.01); *G06N 10/20* (2022.01); *H03B 27/00* (2013.01); *H03H 11/16* (2013.01)

(58) Field of Classification Search
CPC ........ H03K 17/92; G06N 10/20; G06N 10/60; G06N 10/40; H03B 27/00; H03H 11/16
See application file for complete search history.

(56) References Cited

U.S. PATENT DOCUMENTS

| | | | |
|---|---|---|---|
| 2021/0110290 A1 | 4/2021 | Jin et al. | |
| 2021/0350268 A1* | 11/2021 | Whittaker | G01R 33/0358 |
| 2022/0261680 A1 | 8/2022 | Hasegawa et al. | |

FOREIGN PATENT DOCUMENTS

| | | |
|---|---|---|
| JP | 2018-180084 A | 11/2018 |
| JP | 2021-064361 A | 4/2021 |
| WO | 2021/014888 A1 | 1/2021 |

OTHER PUBLICATIONS

H. Goto, et al., "Boltzmann sampling from the Ising model using quantum heating of coupled nonlinear oscillators", Nature, Scientific Reports 8:7154 (2018).
Puri, et al., "Quantum annealing with all-to-all connected nonlinear oscillators", Nature Communications 8:15785 (2017).

* cited by examiner

*Primary Examiner* — Jeffrey M Shin
(74) *Attorney, Agent, or Firm* — Sughrue Mion, PLLC

(57) ABSTRACT

A superconducting quantum circuit apparatus, including: two or four Josephson parametric oscillators, JPOs, each including: a SQUID; and a pump line, with a pump signal supplied thereto, providing a magnetic flux penetrating through the loop of the SQUID, the JPOs oscillating parametrically in response to the pump signal supplied to the pump line; a coupler to couple the two or four JPOs; and a phase adjuster that varies a relative phase between or among pump signals supplied respectively to the pump lines of the two or four JPOs for parametric oscillation, to vary a strength of a two-body or four-body interaction.

18 Claims, 19 Drawing Sheets

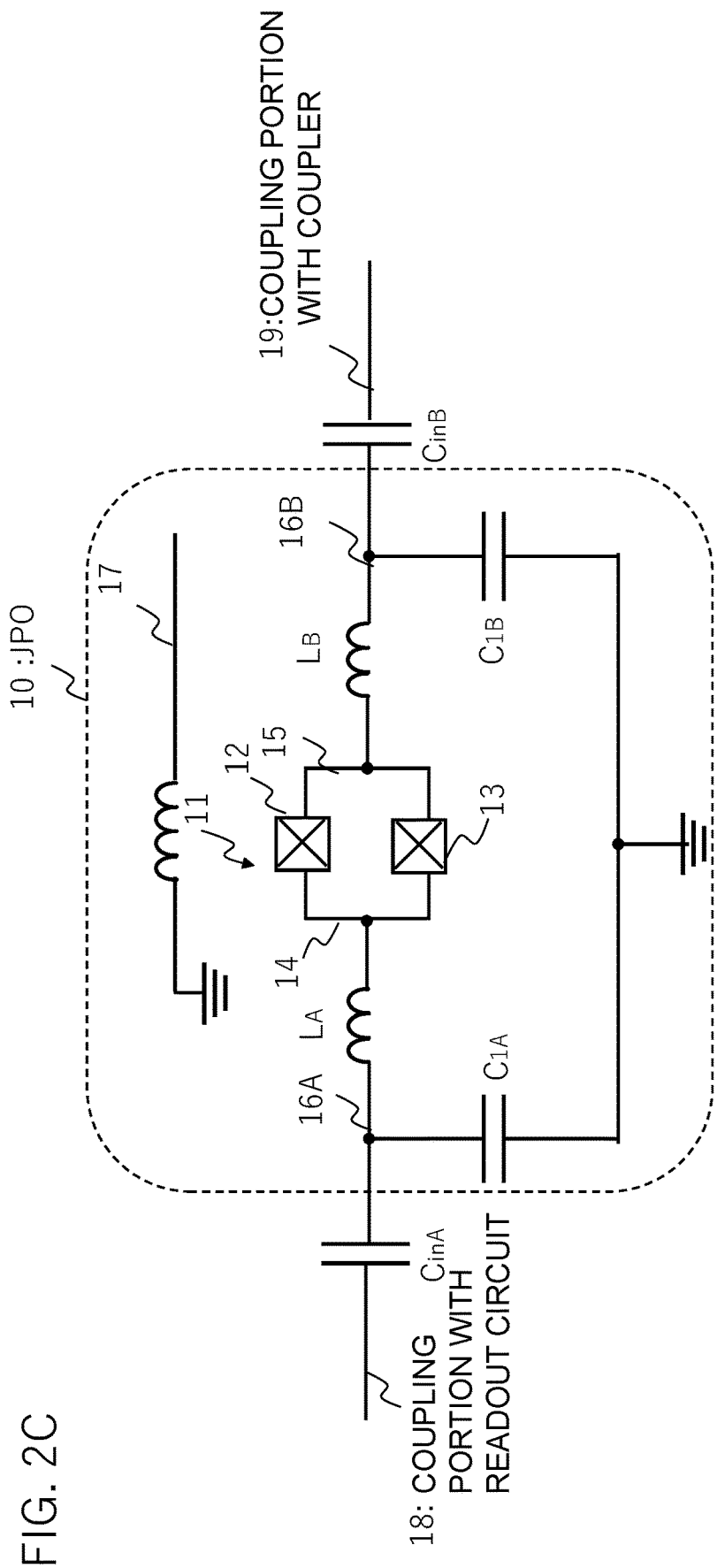

SUPERCONDUCTING QUANTUM CIRCUIT APPARATUS AND CONTROL METHOD FOR A SUPER CONDUCTING QUANTUM CIRCUIT

CROSS REFERENCE TO RELATED APPLICATIONS

This application is based upon and claims the benefit of the priority of Japanese patent application No. 2021-189597, filed on Nov. 22, 2021, the disclosure of which is incorporated herein in its entirety by reference thereto.

FIELD

The present invention relates to a superconducting quantum circuit apparatus and a control method for a superconducting quantum circuit.

BACKGROUND

A quantum bit (qubit) formed of a superconducting quantum circuit is typically coupled to a waveguide(s) for readout or manipulation of a quantum state and to other qubit(s). This kind of coupling can be broadly classified into the following two schemes.
(a) Fixed coupling strength (or intensity) scheme: A coupling strength is fixed according to a circuit geometry (such as capacitance and mutual inductance, mode coupling between a three-dimensional cavity and a planar circuit).
(b) Variable (Tunable) coupling strength scheme: A coupling strength can be tuned by using a resonator or the like as a coupler. In this scheme, a coupling strength can be changed without changing a circuit layout.

Since a waveguide used for readout or manipulation of a quantum state is rather easy to implement and there is less need to adjust a coupling strength thereof, (a) fixed coupling strength scheme is often used for coupling to the waveguide.

On the other hand, as for a coupling between qubits, (b) variable coupling strength scheme is desirable for convenience of use in quantum computation.

When Josephson parametric oscillators (amplifiers) are used as qubits to perform quantum annealing, the qubits are coupled to each other by a two-body or four-body interaction coupler, a coupling strength of which is preferably enabled to be adjustable (or tunable).

Patent Literature (PTL) 1 discloses a quantum gate device to control a coupling strength of a resonator. The quantum gate device includes a superconducting qubit coupled to the resonator, a first waveguide coupled to the resonator and configured to receive a microwave photon, a second waveguide coupled to the superconducting qubit and configured to receive a microwave drive light, and an operation unit capable of controlling at least one of a frequency of the microwave drive light, an intensity of the microwave drive light, a frequency of the resonator, a frequency of the superconducting qubit, and a coupling strength between the superconducting qubit and the resonator.

Non-Patent Literature (NPL) 1 discloses that, when a drive light with a frequency equal to an oscillation frequency is injected to a qubit, its effect corresponds to a local field in an Ising model and depends on a relative phase between the drive light and a pump signal.

NPL 2 discloses a four-body interaction coupler with a tunable coupling strength using a Josephson Ring Modulator (JRM), as illustrated in FIG. 7. FIG. 7 is a figure cited from Supplementary FIG. 8: Tunable four-body coupling with JRM in the NPL 2.

In FIG. 7, each Josephson Parametric Oscillator (JPO) is provided with a Superconducting Quantum Interference Device (SQUID) and two coplanar waveguides (CPW) connected at both ends of the SQUID. The SQUID is configured to have a loop circuit in which a first superconducting line, a first Josephson Junction (JJ), a second superconducting line, and a second Josephson junction are connected in a loop. Since the Josephson Parametric Amplifier (JPA) in NPL 2 is the same oscillator as the Josephson parametric oscillator, it is referred to as a Josephson Parametric Oscillator (JPO) in the present description. Microwave drive signals with equal strength but opposite phase are applied to capacitors $C_x$ and $C_y$ (as shown with solid and dashed arrows) to trigger the four-body coupling between the JPOs. Tunable four-body interaction is implemented by using an imbalanced shunted Josephson Ring Modulator (JRM). JRM is provided with two pairs of Josephson Junctions (JJs). In each pair, the Josephson junctions are connected in series. The two pairs of Josephson junctions are connected in parallel between a first node and a second node, where the first node is a connection node of JPO1 and JPO2, and the second node is a connection node of JPO3 and JPO4. Microwave drive signals are applied to the first and second nodes via the capacitors $C_x$, respectively, and microwave drive signals with opposite phase are applied via the capacitors $C_y$ to connection nodes of Josephson Junctions (JJs) of each pair, respectively. In FIG. 7, $3\Phi_{ex}$ and $\Phi_{ex}$ shown close to inductors of the JRM are external magnetic flux applied to big and small loops of the JRM, respectively and $a_i(i=1\sim4)$ is a mode operator of each JPO.

FIGS. 8A, 8B, and 8C are figures based on a, b, and c of FIG. 4 in the NPL 2. As described above, JPA in FIG. 4 in the NPL 2 is denoted as JPO. FIG. 8A illustrates a system in which four JPOs of resonance frequencies $\omega_{r,i}$ (i=1, 2, 3, 4) interact via a single Josephson Junction (JJ) disposed at a center (central JJ). To realize a time-dependent two-photon drive, the SQUID loop of each JPO is driven by a flux pump with tunable amplitude and frequency. The pump frequency $\omega_{p,k}(t)$ (k=1, 2, 3, 4) is able to be varied close to a frequency $2\omega_{r,i}$ that is twice the resonance frequency of JPOi. Local four-body couplings are realized through a nonlinear inductance of the Josephson junction JJ disposed at a center (central JJ).

The four JPOs are respectively driven by pump signals with frequencies such that:

$$\omega_{p,1}(t)+\omega_{p,2}(t)=\omega_{p,3}(t)+\omega_{p,4}(t) \tag{1}$$

and the JPOs are detuned. When the JPOs are detuned from each other, the Josephson junction JJ (central JJ) at the center induces a coupling of the following form in a rotating frame (or rotating coordinate system) of the two-photon drives:

$$-C(a_1^\dagger a_2^\dagger a_3 a_4 + h.c.) \tag{2}$$

where
C is a coupling strength (coupling constant),
$a_i$ is an operator of a resonance mode of each JPO ($a_i^\dagger$ is a creation operator, and $a_i$ is an annihilation operator) (a hat symbol ^ for the operator is omitted), and
h.c. inside the parentheses indicates the Hermitian conjugate of the first term inside the parentheses.

This four-body interaction is always active and the coupling strength C depends on nonlinearity of the Josephson junction JJ (central JJ) and/or detuning between the JPOs and the Josephson junction (central JJ).

A group of four JPOs (which is referred to as a plaquette in NPL 2) illustrated in FIG. 8A, is a main building block of an architecture. By using square lattices, it is possible to scale up to a pyramid form needed to implement an LHZ (Lechner, Hauke, Zoller) scheme. While pump signals applied to JPOs within a plaquette have different frequencies, only four distinct frequencies of pump signals are required for entire lattices. The LHZ scheme can implement a so-called full coupling type, in which all logical spins are two-body coupled to each other, by making the JPOs in the plaquette interact with each other in the four-body interaction, for example, via a JRM (FIG. 7) or a single Josephson junction. In the LHZ scheme, it is desirable for a four-body interaction within each plaquette to be variable depending on a problem to be solved in order to provide a condition (constraint) that each JPO should satisfy to represent full coupling among logical bits. As an example, FIG. 8B illustrates all coupling combinations in a case where N=5 logical spins are fully coupled.

Energy of the Ising model with M physical spins (Ising spins) is given as $$E = \Sigma_{i=1}^{M} h_i s_i - \Sigma_{i \neq j=1}^{M} J_{i,j} s_i s_j \qquad (3)$$

where $J_{ij}$ is a parameter corresponding to a coupling coefficient for two-body interaction, $h_i$ is a parameter corresponding to a local field (local magnetic field), and $s_i$ is an i-th physical spin which takes +1 (up) or −1 (down).

As an example, FIG. 8C illustrates a case implementing the full coupling of N=5 logical spins with the LHZ scheme. N=5 logical spins are mapped to M=N(N−1)/2=10 physical spins. A pair of logical spins is mapped on the two levels of the physical spin. A coupling $J_{i,j}$ ($i \neq j=1, \ldots, N$) between the i-th and j-th logical pairs is encoded in a local magnetic field $J_k$ (k=1, ..., M) on the physical spins. In FIG. 8C, three bits (denoted by "Fixed") at the bottom side of the LHZ triangular structure (or network) are fixed to up state.

PTL 1: Japanese Patent Kokai Publication No. 2018-180084A

NPL 1: H. Goto, et. al., "Boltzmann sampling from the Ising model using quantum heating of coupled nonlinear oscillators", Nature, Sci. Rep. 8, 7154 (2018)

NPL2: Puri, et. al., "Quantum annealing with all-to-all connected nonlinear oscillators", Nature Communications 8, 15785 (2017)

SUMMARY

In the related art, as disclosed in NPL 2, etc., an additional drive signal(s) is(are) required to realize four-body interaction with a tunable coupling strength, and a large number of electronic components, circuits, etc., are needed for its manipulation. According to the related technology, it is difficult to realize a superconducting quantum circuit with high scalability.

Therefore, it is an object of the present disclosure to provide a superconducting quantum circuit apparatus and a control method thereof, each enabling to solve the above-described issues.

According to one aspect of the present invention, there is provided a superconducting quantum circuit apparatus, comprising two or four Josephson parametric oscillators, each Josephson parametric oscillator including:
a SQUID (Superconducting Quantum Interference Device) including a first superconducting line, a first Josephson junction, a second superconducting line, and a second Josephson junction connected in a loop; and
a pump line, with a pump signal supplied thereto, providing a magnetic flux penetrating through the loop of the SQUID, the two or four Josephson parametric oscillators each oscillating parametrically in response to the pump signal supplied to the pump line thereof;

a coupler to couple the two or four Josephson parametric oscillators; and a phase adjuster that varies a relative phase between or among pump signals supplied for parametric oscillation to the pump lines of the two or four Josephson parametric oscillators, respectively, to vary a strength of a two-body or four-body interaction.

According to another aspect of the present invention, there is provided a control method for a superconducting quantum circuit apparatus, wherein the superconducting quantum circuit comprises:

two or four Josephson parametric oscillators, each Josephson parametric oscillator including:
a SQUID (Superconducting Quantum Interference Device) including a first superconducting line, a first Josephson junction, a second superconducting line, and a second Josephson junction connected in a loop; and
a pump line, with a pump signal supplied thereto, providing a magnetic flux penetrating through the loop of the SQUID, the two or four Josephson parametric oscillators each oscillating parametrically in response to the pump signal supplied to the pump line thereof; and a coupler to couple the two or four Josephson parametric oscillators. The control method comprises adjusting a relative phase between or among the pump signals supplied for parametric oscillation to the two or four Josephson parametric oscillators, respectively, to tune a strength of a two-body or four-body interaction.

According to the present disclosure, it is possible to realize a superconducting quantum circuit with high scalability in terms of scale and with tunable coupling strength.

BRIEF DESCRIPTION OF THE DRAWINGS

FIG. 2C is a diagram schematically illustrating another example of the Josephson parametric oscillator according to the example embodiment.

DETAILED DESCRIPTION

The following describes several example embodiments of the present disclosure. According to an example embodiment, it is made possible to variably set (tune) an effective coupling strength by adjusting a relative phase of pump signals, by utilizing a fact that a two-body interaction between two Josephson parametric oscillators (JPOs) and a•four-body interaction among four JPOs, both depend on a relative phase between or among pump signals applied, respectively, to the two or four JPOs.

Figure 1:
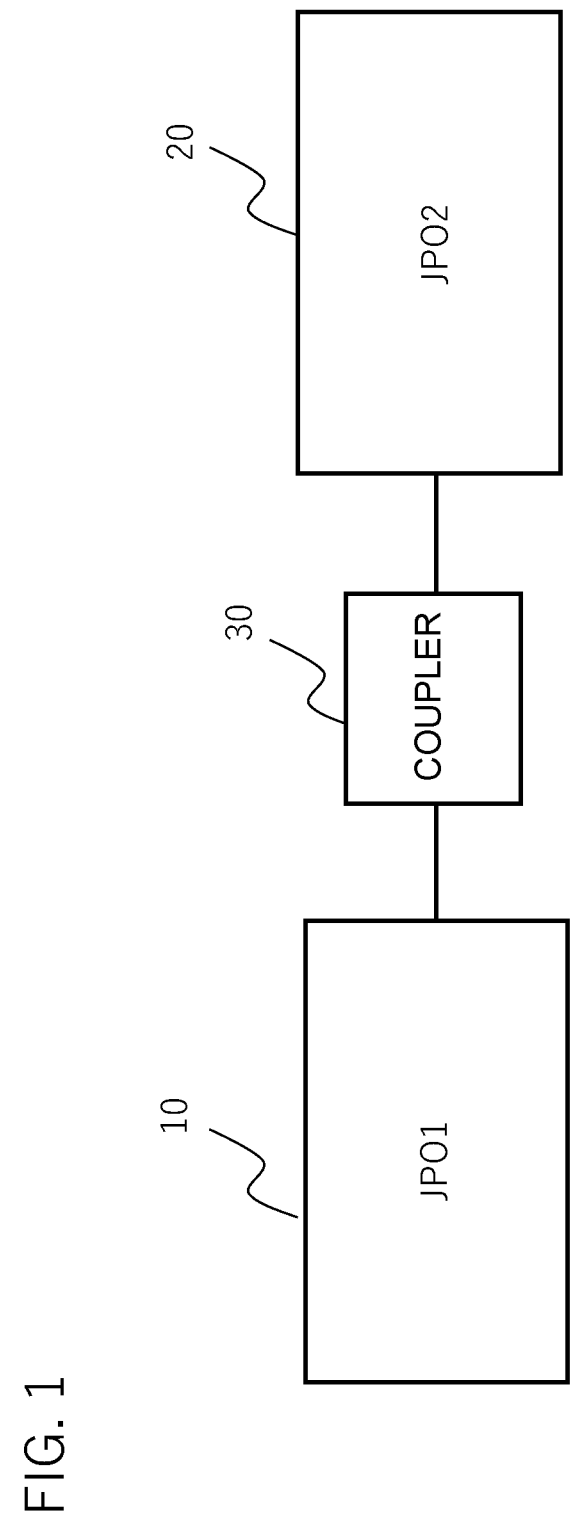
FIG. 1 is a diagram schematically illustrating an example embodiment.

FIG. 1 illustrates one example embodiment. In FIG. 1, a first JPO 10, a second JPO 20 and a coupler coupling the first JPO 10 and the second JPO 20 are illustrated. In FIG. 1, the first and second JPOs are denoted as JPO1 and JPO2, respectively. According to the present example embodiment, an effective coupling strength between the first and second JPOs can be variably adjusted by adjusting a relative phase (e.g., $\theta_1-\theta_2$) of phases $\theta_1$ and $\theta_2$ of pump signals (each having a frequency $\omega_p$ close to twice a resonance frequency of the JPO) applied, respectively, to two Josephson parametric oscillators (JPOs) 10 and 20.

There are typically two types of structures for the JPO.
(1) A superconducting part (electrode) coupled capacitively to a ground plane and one end of a SQUID are connected, while the other end of the SQUID is grounded. In the case of a distributed element structure, the one end of the SQUID is connected to a λ/4 type resonator.
(2) A superconducting part (electrode) capacitively coupled to a ground plane is separated by a SQUID into a first superconducting part (electrode) and a second superconducting part (electrode). One end of the SQUID is connected to the first superconducting part and the other end of the SQUID is connected to the second superconducting part. In the case of a distributed element structure, a λ/2 type resonator is separated by a SQUID into a first λ/4 type resonator and a second λ/4 type resonator. The one end of the SQUID is connected to the first λ/4 type resonator and the other end of the SQUID is connected to the second λ/4 type resonator.

Figure 2A:
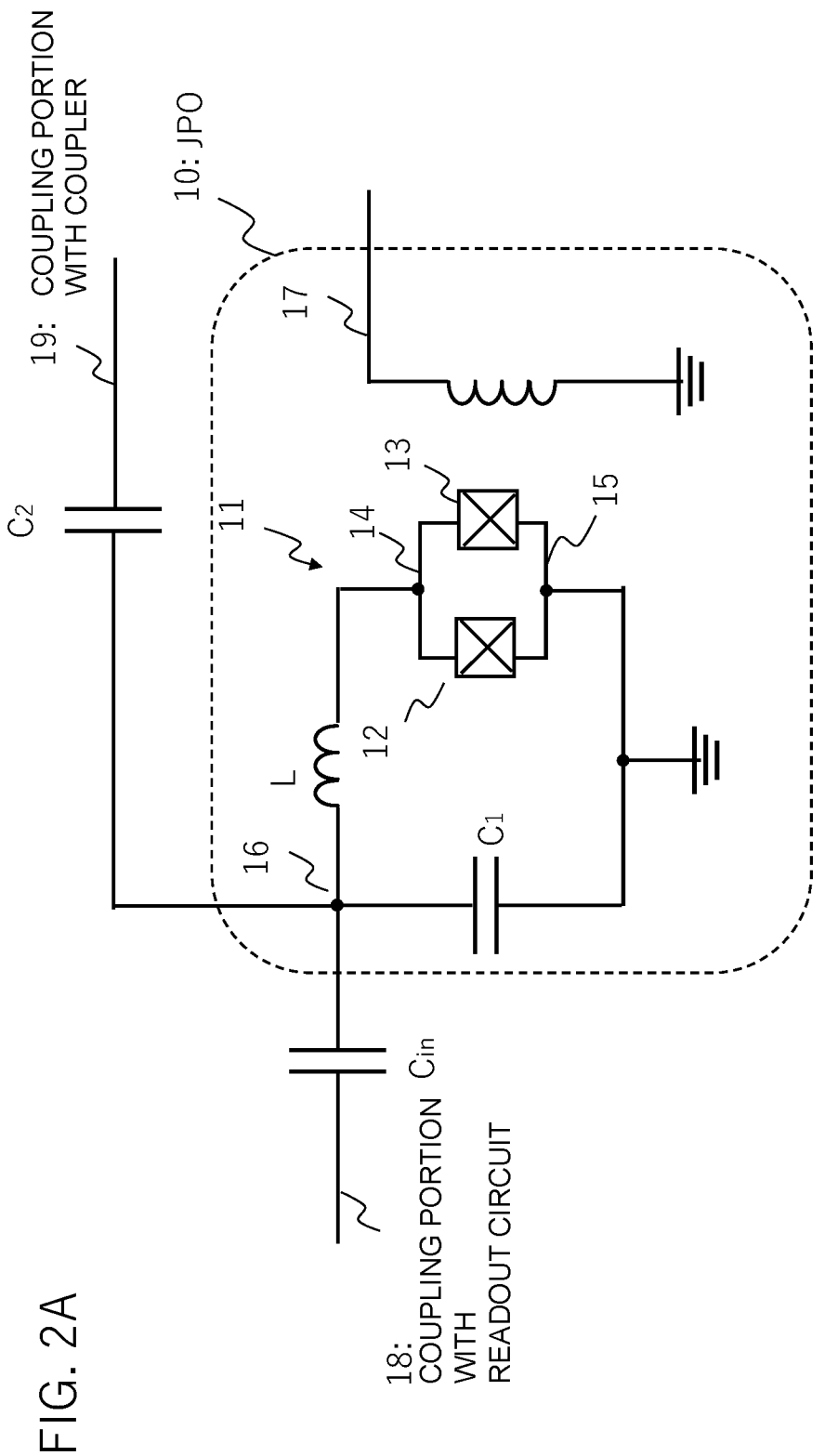
FIG. 2A is a diagram schematically illustrating an example of a Josephson parametric oscillator according to the example embodiment.
Figure 2B:
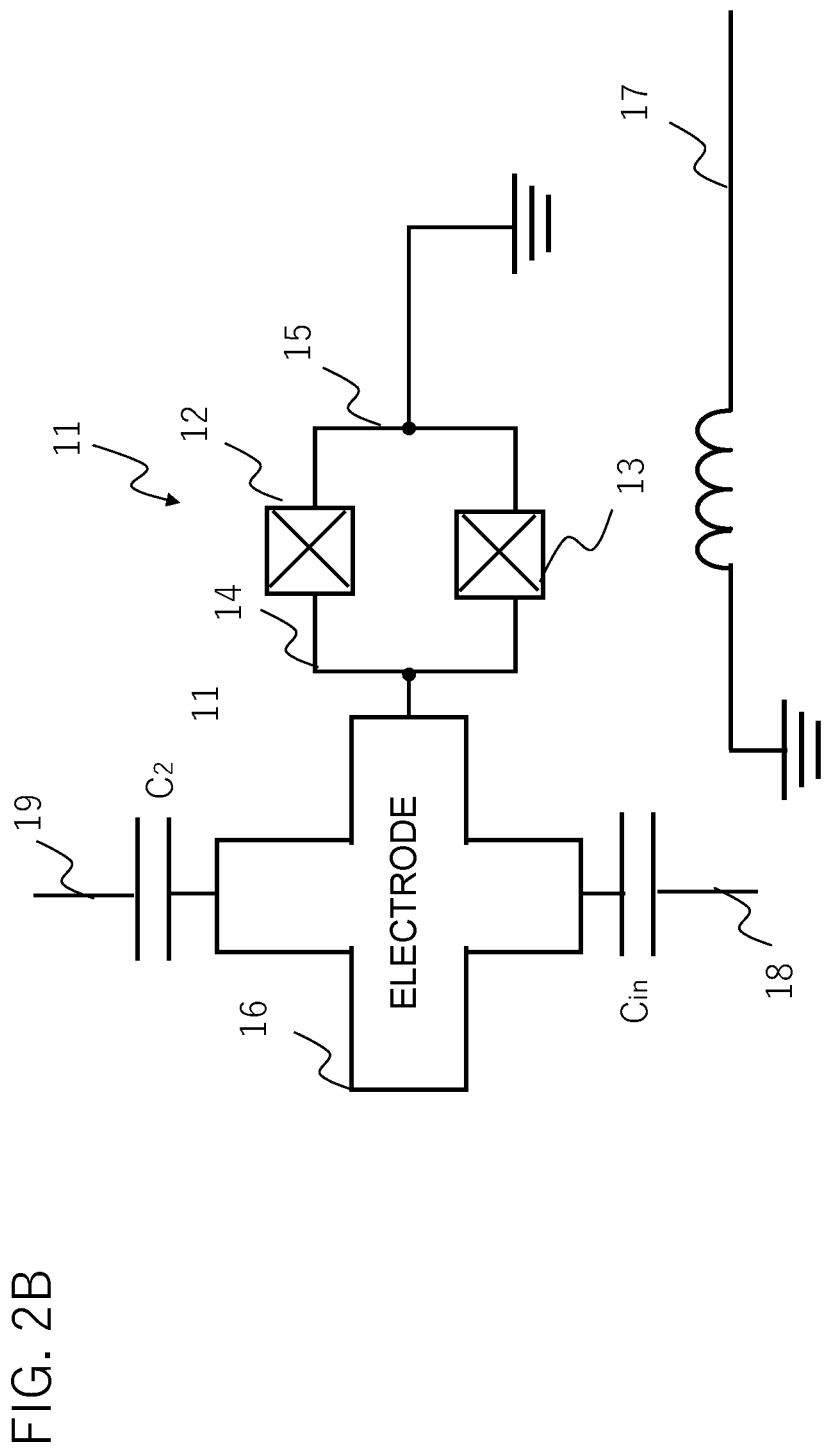
FIG. 2B is a diagram schematically illustrating an example of a Josephson parametric oscillator according to the example embodiment.

The following outlines examples of a configuration of a JPO. Since JPOs (first and second JPOs 10 and 20) in FIG. 1 have the same configuration, only the configuration of the first JPO 10 will be described in the following examples. FIG. 2A illustrates an example of a lumped-element structure (1) of the first JPO 10 of FIG. 1. Referring to FIG. 2A, the first JPO 10 includes a SQUID 11 in which a first superconducting line 14, a first Josephson junction 12, a second superconducting line 15, and a second Josephson junction 13 are connected in a loop. The second superconducting line 15 is connected to ground and the first superconducting line 14 is connected to a superconducting part (electrode) indicated by a node 16. FIG. 2B is a schematic plan view illustrating an example of a planar shape of the superconducting part (electrode) indicated by a node 16 in FIG. 2A. Note that an inductance L in FIG. 1, which is connected between the node 16 and the first superconducting line 14, mainly represents an inductance component of the superconducting part (electrode) and can be omitted in a circuit diagram because it is smaller than an inductance (self-inductance) of the SQUID 11. A capacitance C1 between the node 16 and ground designates a capacitance (capacitive component) between the superconducting part (electrode) (16 in FIG. 2B) and ground. The capacitance $C_1$ configures a parallel LC resonant circuit, together with an inductance component such as a self-inductance of the SQUID 11, etc. A line (termed as a pump line) 17 in FIG. 2A is a line through which a current (pump signal) from a current control part (not shown) is supplied to provide a magnetic flux (magnetic field) penetrating through a loop of the SQUID 11. In FIG. 2A, the superconducting part (electrode) (node 16) is connected, via an input/output capacitor $C_{in}$, to a coupling portion 18 that couples with a readout circuit (not shown) and connected, via a capacitor (coupling capacitor) $C_2$, to a coupling portion 19 that couples with a coupler (designated by 30 in FIG. 1). The second JPO 20 in FIG. 1 may have the same configuration as the first JPO 10. Note that, in FIG. 2B, a planar shape of the electrode is, as a matter of course, not limited to a cruciform shape.

Figure 2D:
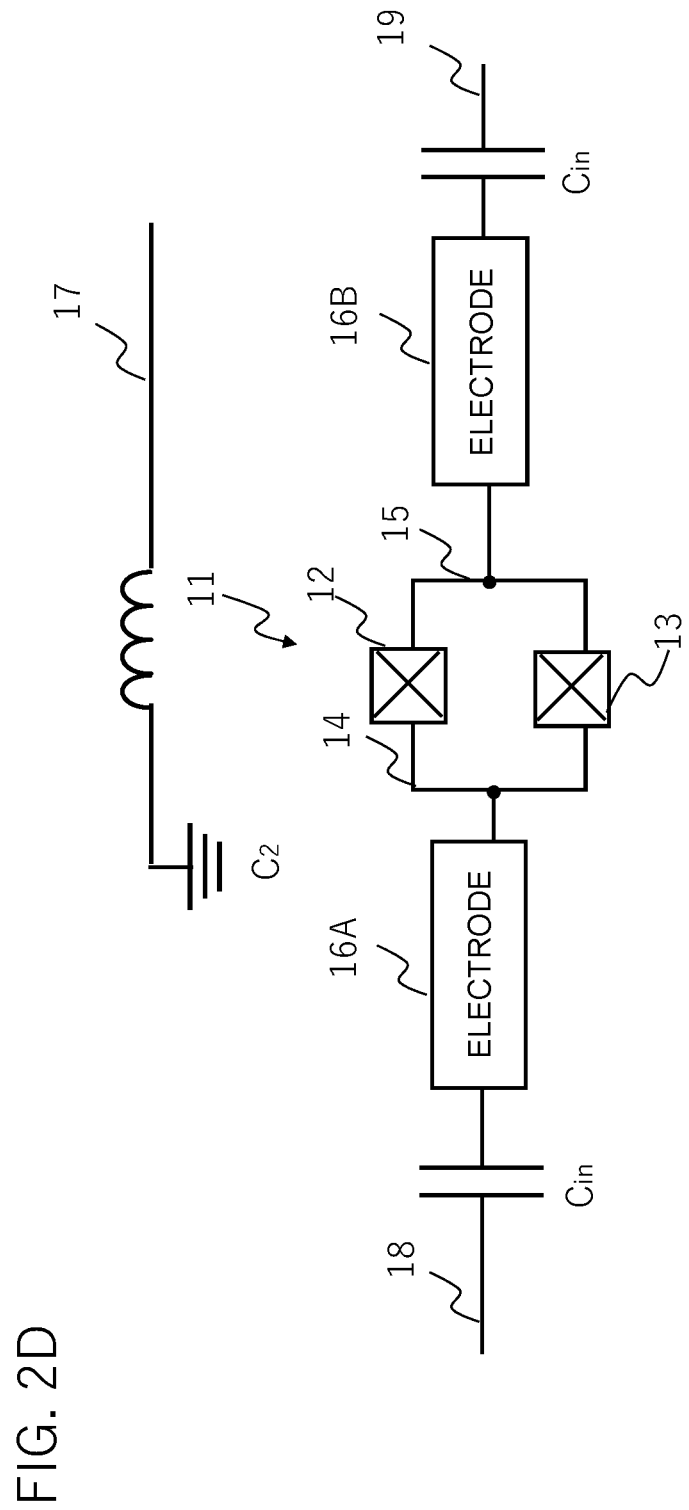
FIG. 2D is a diagram schematically illustrating another example of the Josephson parametric oscillator according to the example embodiment.

FIG. 2C illustrates an example of a lumped element structure (2) as the first JPO 10 of FIG. 1. Referring to FIG. 2C, the first superconducting line 14 of the SQUID 11 is connected, via a first superconducting portion (electrode) indicated by a node 16A and an input/output capacitor $C_{inA}$, to a coupling portion 18 that couples with the readout circuit (not shown). The second superconducting line 15 of the SQUID 11 is connected, via a second superconducting portion (electrode) indicated by a node 16B and an input/output capacitor $C_{inB}$, to a coupling portion 19 that couples with a coupler (denoted 30 in FIG. 1). FIG. 2D is a schematic plan view illustrating an example of a planar shape of the superconducting portions (electrodes) indicated by nodes 16A and 16B in FIG. 2C. The JPO 20 in FIG. 1 may have the same configuration.

Figure 2E:
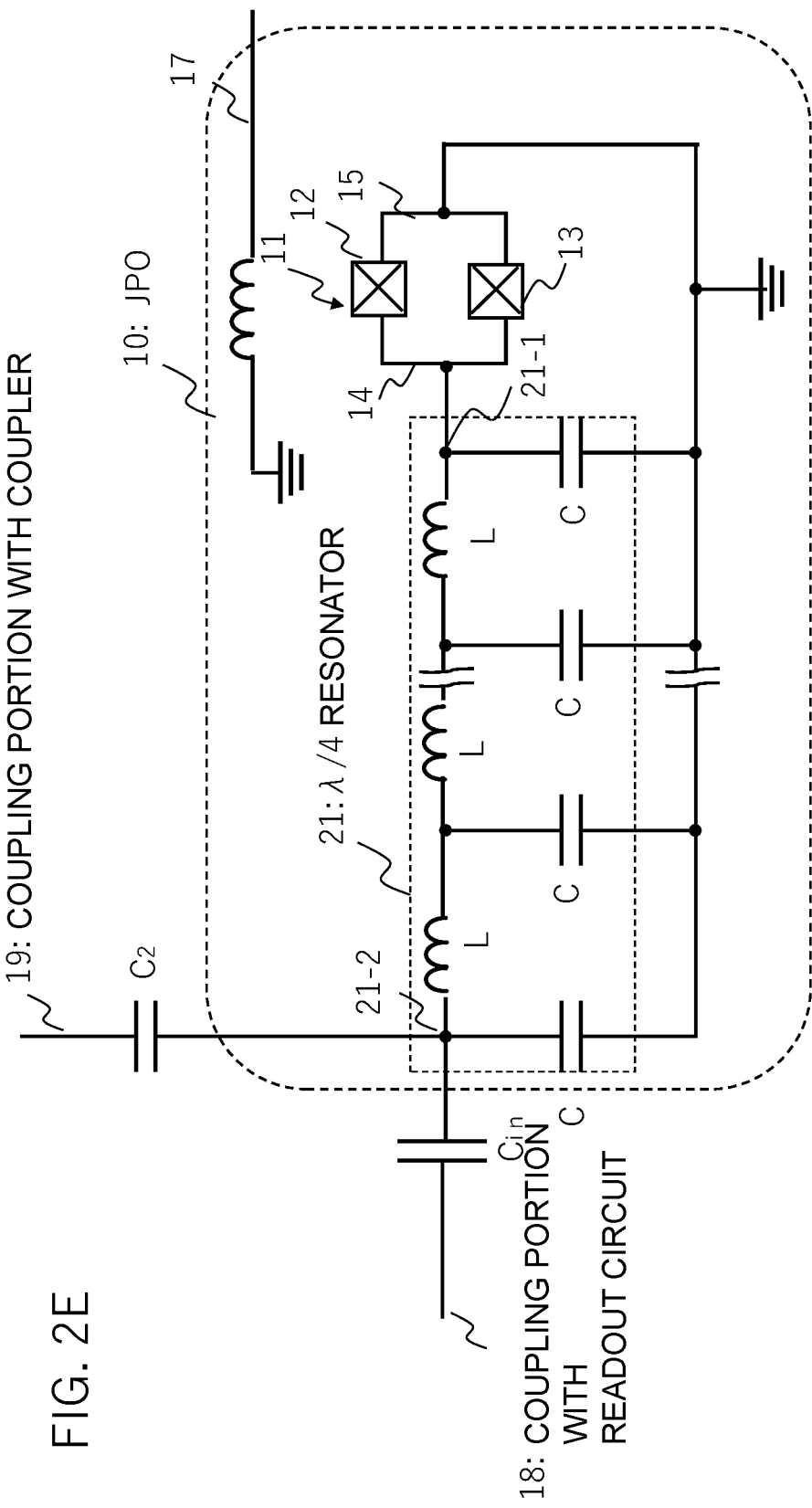
FIG. 2E is a diagram schematically illustrating still another example of the Josephson parametric oscillator according to the example embodiment.

FIG. 2E illustrates an example of a distributed element structure (1) as the first JPO 10 of FIG. 1. In FIG. 2E, a quarter-wavelength (λ/4) resonator 21 is illustrated as a distributed element circuit with multistage connection of four-terminal circuits, each having an inductance L and a capacitance C. A first superconducting line 14 of the SQUID 11 is connected to a node 21-1, which is one end of the λ/4 resonator 21. A node 21-2, which is the other end of the λ/4 resonator 21, is connected, via an input/output capacitor $C_{in}$, to a coupling portion 18 that couples with a readout circuit (not shown) and connected, via a capacitor $C_2$, to a coupling portion 19 that couples with a coupler (designated by 30 in FIG. 1). The JPO 20 in FIG. 1 may have the same configuration.

Figure 2F:
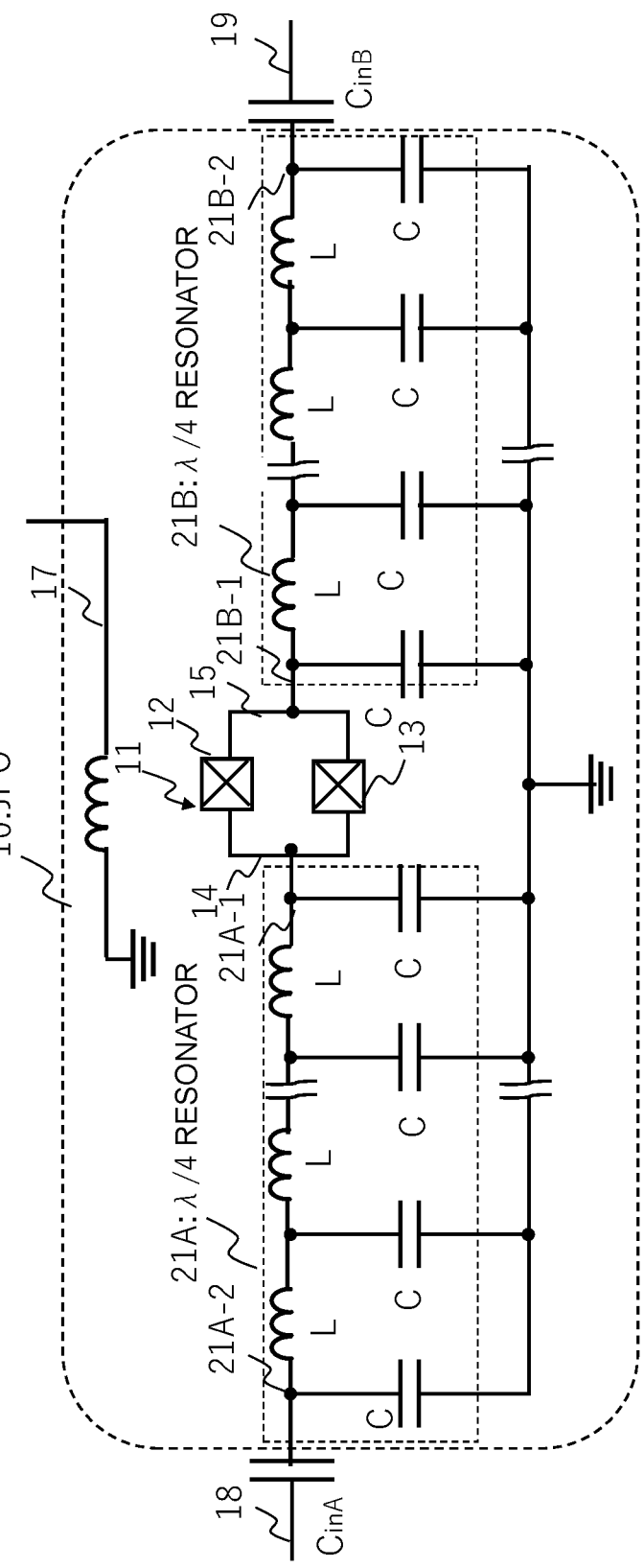
FIG. 2F is a diagram schematically illustrating still another example of the Josephson parametric oscillator according to the example embodiment.

FIG. 2F illustrates an example of a distributed element structure (2) as the first JPO 10 of FIG. 1. In FIG. 2F, a first superconducting line 14 of the SQUID 11 is connected to a node 21A-1, which is one end of a first $\lambda/4$ resonator 21A. A node 21A-2, which is the other end of the first $\lambda/4$ resonator 21A, is connected, via an input/output capacitor $C_{inA}$, to a coupling portion 18 that couples with a readout circuit (not shown). A second superconducting line 15 of the SQUID 11 is connected to a node 21B-1, which is one end of a second $\lambda/4$ resonator 21B. A node 21B-2, which is the other end of the second $\lambda/4$ resonator 21B, is connected, via an input/output capacitor $C_{inB}$, to a coupling portion 19 that couples with a coupler (designated by 30 in FIG. 1). The JPO 20 in FIG. 1 may have the same configuration.

Figure 3A:
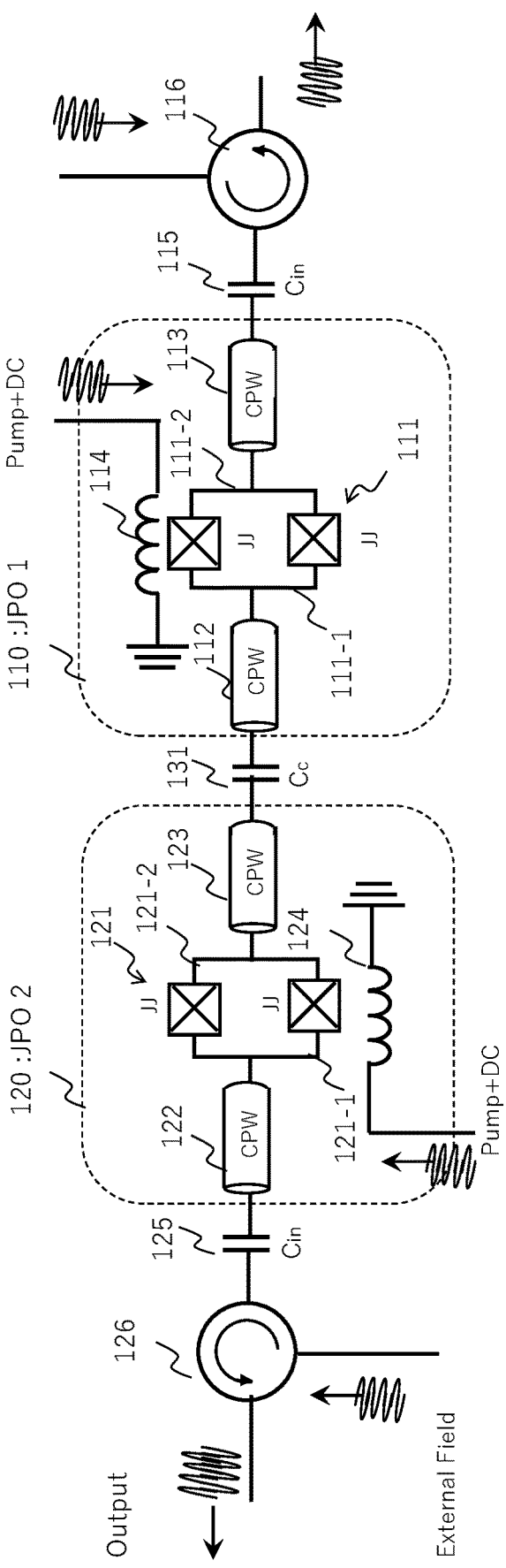
FIG. 3A is a diagram schematically illustrating an example of the example embodiment.

Example embodiment will be described based on the example illustrated in FIG. 2F, as JPOs (the first and second JPOs 10 and 20) in FIG. 1. FIG. 3A illustrates the example embodiment. In FIG. 3A, JPOs 10 and 20 in FIG. 1 are designated by reference numerals 110 and 120, respectively, and a coupler 30 in FIG. 1 is designated by 131.

As illustrated in FIG. 3A, the first and second JPOs 110 and 120 are coupled by the capacitor (Cc) 131. The first JPO 110 includes a SQUID 111, waveguides (Coplanar Waveguide: CPW) 112 and 113, and a pump line 114. The SQUID 111 includes a superconducting line 111-1, a first Josephson Junction (JJ), a superconducting line 111-2, and a second Josephson Junction (JJ) connected in a loop. The waveguides 112 and 113 are connected to the superconducting lines 111-1 and 111-2 of the SQUID 111, respectively. The pump line 114 is coupled (inductively coupled) to the SQUID by mutual inductance. The second JPO 120 includes a second SQUID 121, waveguides 122 and 123, and a pump line 124. The second SQUID 121 includes a superconducting line 121-1, a first Josephson Junction (JJ), a superconducting line 121-2, and a second Josephson Junction (JJ) connected in a loop. The waveguides 122 and 123 are connected to the superconducting lines 121-1 and 121-2 of the second SQUID 121, respectively. The pump line 124 is coupled (inductively coupled) to the SQUID by mutual inductance. In the first JPO 110 (the second JPO 120), the waveguides 112 and 113 (122 and 123) may be, for example, $\lambda/4$ (quarter-wavelength) coplanar waveguides.

It is assumed that a resonance frequency, at a time when a signal having frequency $\omega_0$ is supplied to the first and second JPOs 110 and 120 and a statistic magnetic field $\Phi_{dc}$ is applied to the SQUIDs 111 and 121, is $\omega_0$. The first and second JPOs 110 and 120 are caused to oscillate parametrically when a pump signal (microwave) of sufficiently strong intensity with a frequency $\omega_p$ close to twice the resonance frequency $\omega_0$ to each of the pump lines 114 and 124 are applied in the first and second JPOs 110 and 120. A Hamiltonian H (quantized Hamiltonian), when resonance frequencies of the first and second JPOs 110 and 120 are $\omega_1$ and $\omega_2$, respectively, the first and second JPOs 110 and 120 are capacitively coupled through a capacitor 131 and are driven with pump signals (microwave current) having frequency $\omega_p (\omega_p \approx 2\omega_1, \omega_p \approx 2\omega_2)$, is given by the following Equation (4). Note that the quantized Hamiltonian is generally denoted as $\hat{H}$, but in the Equation (4), the hat $\hat{}$ is omitted. Hereinafter, a Hamiltonian is a quantized Hamiltonian.

$$H/\hbar = \omega_1 a_1^\dagger a_1 + \omega_2 a_2^\dagger a_2 - (K_1/2) a_1^{\dagger 2} a_1^2 - (K_2/2) a_2^{\dagger 2} a_2^2 + (p_1/2)[\exp\{-i(\omega_p*t-\theta_1)\}*a_1^{\dagger 2} + \exp\{-i(\omega_p*t-\theta_1)\}*a_1^2] + (p_2/2)[(\exp\{-i(\omega_p*t-\theta_2)\}*a_2^{\dagger 2} + \exp\{-i(\omega_p*t-\theta_2)\}*a_2^2)] - g(a_1^\dagger a_2 + a_2^\dagger a_1) \quad (4)$$

where hbar is a reduced Planck constant ($=h/(2\pi)$:h is the Planck constant), $\omega_1$ and $\omega_2$ are mode frequencies of the first JPO 110 and the second JPO 120, respectively, $a_i^\dagger$ and $a_i$ (i=1,2) are creation operator and annihilation operator, respectively, of resonance mode for each JPO of the first JPO 110 and the second JPO 120, $a_i^\dagger$ is a Hermitian conjugate of $a_i$.

The following exchange relations hold between $a_i^\dagger$ and $a_i$.(i=1, 2).

$$[a_i,a_j^\dagger]=a_i a_j^\dagger - a_j^\dagger a_i = \delta_{ij} (\delta_{ij} \text{ is 1 if } i=j, \text{ and 0 if } i \neq j)[a_i, a_i] = [a_i^\dagger, a_i^\dagger] = 0 \quad (5)$$

A creation operator $a_i^\dagger$ and an annihilation operator $a_i$ are usually denoted as $\hat{a}_i^\dagger$, and $\hat{a}_i$ with a hat $\hat{}$ in a quantum field theory, etc., but the hat $\hat{}$ is omitted in the present description.

$K_1$ and $K_2$ are Kerr coefficients representing amplitudes of Kerr-nonlinearity on the first JPO 110 and the second JPO 120, respectively, $p_1$ and $p_2$ are pump amplitudes of parametric amplifications on the first JPO 110 and the second JPO 120, respectively, $\omega_p$ is a frequency of the pump signal supplied for the parametric amplifications from pump lines 114 and 124, $\theta_1$ and $\theta_2$ are phases of the pump signals supplied for the parametric amplifications from pump lines 114 and 124, respectively, and g is a coupling constant of a two-body interaction between the first JPO 110 and the second JPO 120.

The coupling constant g between the first JPO 110 and the second JPO 120 indicates that both are ferromagnetically coupled with a coupling strength almost constant.

In the Equation (4), when a unitary transformation is applied, at is replaced as follows:

$$a_i \rightarrow \exp\{-i(\omega_p*t-\theta_i)/2\} a_i (i=1,2) \quad (6)$$

Then, the Hamiltonian is transformed into a rotating frame which rotates at $\omega_p/2$. By leaving only terms that do not oscillate in time, the Hamiltonian of the above Equation (4) is given by the following Equation (7).

$$H/\hbar = \Delta_1 a_1^\dagger a_1 + \Delta_2 a_2^\dagger a_2 - (K_1/2) a_1^{\dagger 2} a_1^2 - (K_2/2) a_2^{\dagger 2} a_2^2 + (p_1/2)(a_1^{\dagger 2}+a_1^2)+(p_2/2)(a_2^{\dagger 2}+a_2^2) - g[\exp\{i(\theta_2-\theta_1)/2\} a_1^\dagger a_2 + \exp\{-i(\theta_2-\theta_1)/2\} a_2^\dagger a_1] \quad (7)$$

where $$\Delta_1 = \omega_1 - \omega_p/2 \quad (8a)$$

$$\Delta_2 = \omega_2 - \omega_p/2 \quad (8b)$$

That a coefficient of $a_i^\dagger a_i$ (i=1,2) is $\Delta_i$ in the Equation (7), indicates that an oscillation frequency of an electromagnetic field seen from the rotating frame (rotating at $\omega_p/2$) is $\Delta_i = \omega_i - \omega_p/2$.

Replacing $a_i$ by $\exp(-i \omega_p t) a_i$ according to the Equation (6) is equivalent to use an interaction picture (model) with $$H_0 = \omega_1 a_i^\dagger a_i \quad (9a)$$

$$H_1 = H - H_0 \quad (9b)$$

wherein $(\omega_p/2) a_i^\dagger a_i$ is regarded to have been included in a non-perturbation term of the Hamiltonian.

Changing a relative phase $\theta_p(=\theta_2-\theta_1)$ between the pump signals of the first JPO 110 and the second JPO 120 corresponds to rotating a relative phase of oscillation in the JPO by $\theta_p/2$.

On a right side of the above Equation (7), terms involving in the oscillation of each JPO (the first six terms) do not depend on the relative phase $\theta_p$, but the last term, which is a two-body interaction term:

$$g[\exp\{i(\theta_2-\theta_1)/2\}a_1^\dagger a_2 + \exp\{-i(\theta_2-\theta_1)/2\}a_2^\dagger a_1] \quad (10),$$

depends on the relative phase $\theta_p$. That is, a real part of the term (10) depends on $\theta_p$ in the form of $\cos(\theta_p/2)$.

Therefore, a magnitude and sign of the effective strength of the two-body interaction can be adjusted by adjusting the relative phase $\theta_p$ between the pump signals of the first JPO 110 and the second JPO 120. Note that the case where $\theta_p/2=180$ deg. corresponds to inverting a sign of an Ising spin from positive to negative, which substantially corresponds to inverting a ferromagnetic interaction to an antiferromagnetic interaction.

Figure 3B:
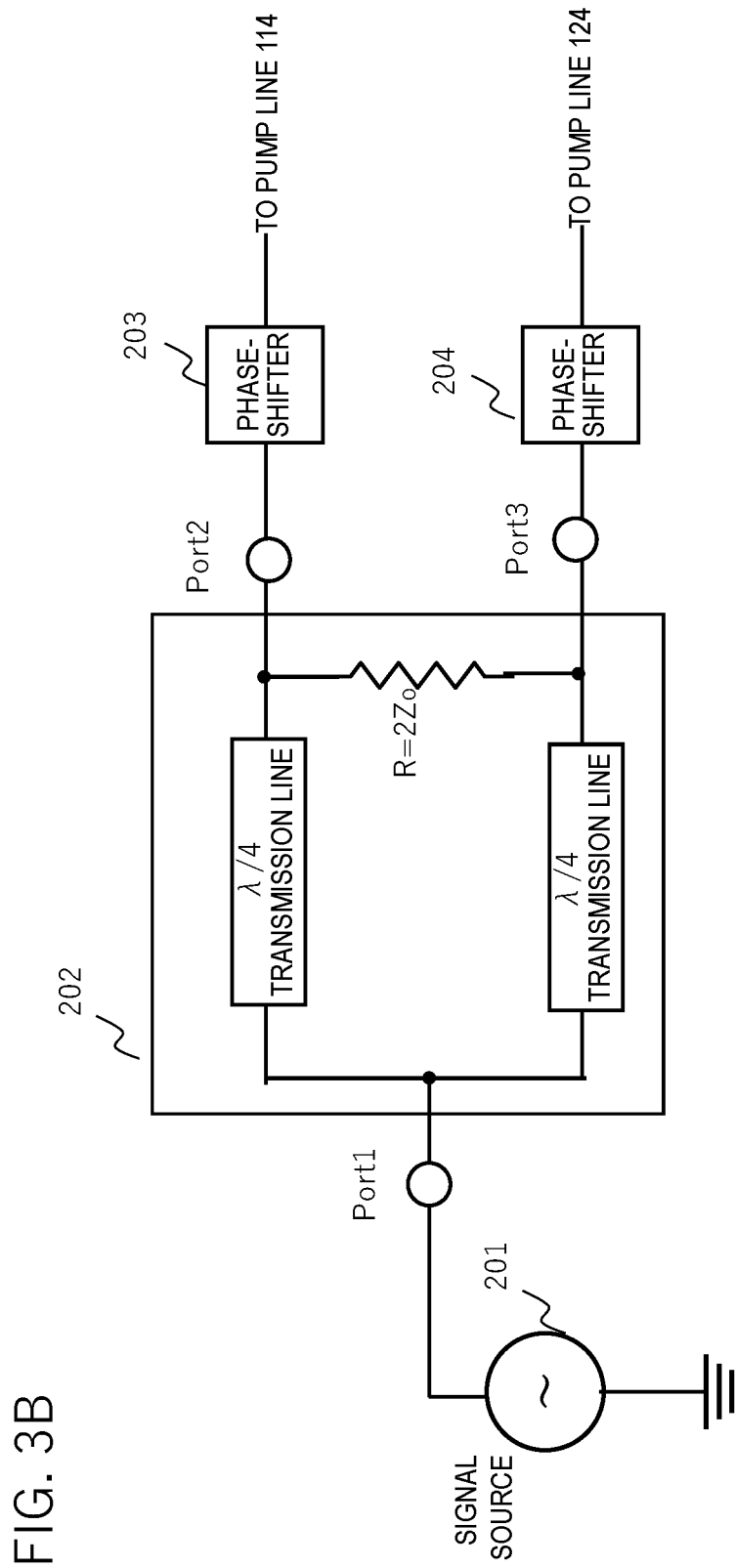
FIG. 3B is a diagram schematically illustrating an example of the example embodiment.

Adjustment of the relative phase $\theta_p$ between the pump signals of the first JPO 110 and the second JPO 120 can be simply implemented. FIG. 3B illustrates an example of a phase adjuster to adjust the relative phase $\theta_p$ between the pump signals of the first JPO 110 and the second JPO 120. As illustrated in FIG. 3B, a distributor 202 may branch a signal, which is generated by a signal source (signal generator) 201 and is received via a port 1, into two signals for output to a port 2 and a port 3, respectively. Phase-shifters 203 and 204 may perform phase-shifting of signals output from the ports 2 and 3, respectively. That is, the phase-shifter 203 supplies an output signal (phase: $\theta_1$) from the port 2 to the pump line 114. The phase-shifter 204. The phase-shifter 204 delays an output signal (phase: $\theta_1$) from the port 3 by the relative phase $\theta_p$ for the signal from the port 2 and supplies an output signal (phase: $\theta_2=\theta_1+\theta_p$) to the pump line 124, wherein a phase of the output signal (phase: $\theta_1$) from the port 3 is delayed by the relative phase $\theta_p$ to the output signal from the port 2, to the pump line 124.

In FIG. 3B, phase-shifters 203 and 204 may be configured with delay lines whose delay can be varied by a control signal (not shown). In this case, each of the phase-shifters 203 and 204 may be provided with two or more delay lines with delay times thereof different to each other, among which one delay line selected by a switch (selector) based on the control signal is inserted into each transmission line of the phase-shifters 203 and 204. Note that in FIG. 3B, it suffices that the relative phase $\theta_p$ is set to microwave signals supplied to the pump lines 114 and 124. Therefore, there may be provided only one of the phase-shifters 203 and 204.

In FIG. 3B, a Wilkinson distributor (power distributor) is illustrated as the distributor 202. Two separated signals are, via $\lambda/4$ (quarter-wavelength) transmission lines ($\lambda/4$ transformers) connected in parallel, output to the ports 2 and 3, respectively. A characteristic impedance Z of each $\lambda/4$ transmission line is $\sqrt{2}Zo$. A resistor (R=2×Zo, where Zo is a characteristic impedance of a transmission line on the input port 1 side) provided between the ports 2 and 3 enables impedance matching and maintaining isolation at the output ports 2 and 3. Since signals with amplitudes and phases both being the same pass through the ports 2 and 3, no current flows through the resistor between the ports 2 and 3. The distributor 202 is, as a matter of course, not limited to Wilkinson power distributor and may be a resistive distributor or the like.

Figure 3C:
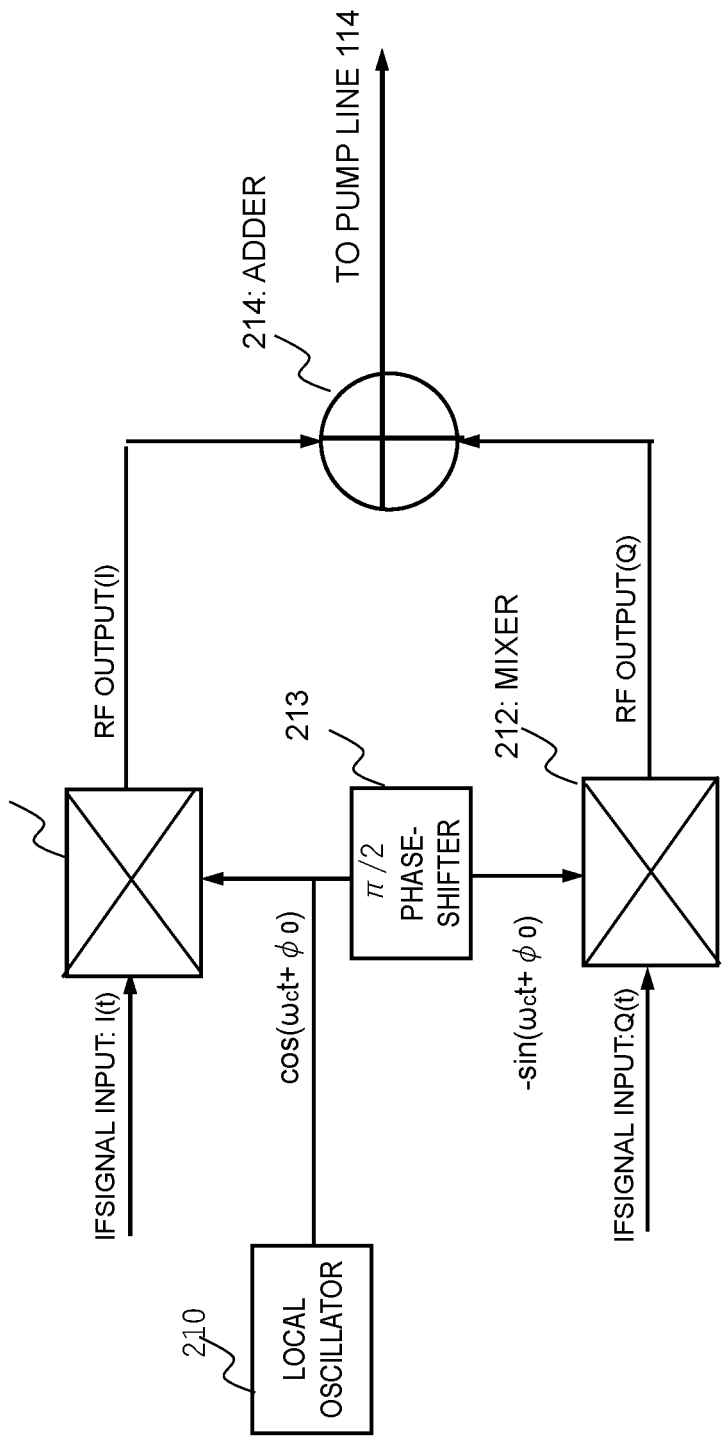
FIG. 3C is a diagram schematically illustrating an example of the example embodiment.

FIG. 3C illustrates another configuration to implement simplified adjusting of the relative phase $\theta_p$ between the pump signals of the first JPO 110 and the second JPO 120. For example, a signal source supplying a pump signal to the first JPO 110, is provided with a mixer 211, a mixer 212 and an adder 214. An in-phase component I(t) of an intermediate frequency signal (IF) and a local oscillation signal $\cos(\omega_{LO}t+\theta_0)$ (where $\omega_{LO}$ is an angular frequency of the local oscillation signal and $\theta_0$ is an initial phase) from the local oscillator 210 are supplied to the mixer 211. A quadrature-phase Q(t) and a signal $-\sin(\omega_{LO}t+\theta_0)$ output from a $\pi/2$ phase-shifter 213 that phase-shifts the local oscillation signal supplied to the mixer 211 by $\pi/2$(90 degrees) are supplied to the mixer 212. The adder 214 adds an RF (Radio Frequency) output signal (I) from the mixer 211 and an RF output signal (Q) from the mixer 212. An output signal from the adder 214 is supplied to the pump line 114. By adjusting the initial phase (e.g., $\theta_0$) of the local oscillation signal in the local oscillator 210, the relative phase $\theta_p$ between the pump signals of the first JPO 110 and the second JPO 120 may be set to be variable. Alternatively, by adjusting the initial phase of the IF signal by phase modulation (phase shift keying), the relative phase $\theta_p$ between the pump signals of the first JPO 110 and the second JPO 120 may be set to be variable.

In FIG. 3C, letting the IF signal I(t) supplied to the mixer 211 $\cos(\omega_{IF}t)$ (where $\omega_{IF}$ is an angular frequency of the IF signal and the amplitudes thereof is 1), the RF (radio frequency) signal output from the mixer 211 is given by $$\cos(\omega_{IF}t) \times \cos(\omega_{LO}t + \theta_0) = \quad (11)$$
$$(1/2)[\cos\{(\omega_{IF} + \omega_{LO})t + \theta_0\} + \cos\{(\omega_{IF} - \omega_{LO})t - \theta_0\}]$$

Letting the IF signal Q(t) supplied to the mixer 212 $\sin(\omega_{IF}t)$, the RF (radio frequency) output from the mixer 212 is given by $$\sin(\omega_{IF}t) \times \{-\sin(\omega_{LO}t + \theta_0)\} = \quad (12)$$
$$-(1/2)[\cos\{(\omega_{IF} - \omega_{LO})t - \theta_0\} - \cos\{(\omega_{IF} + \omega_{LO})t + \theta_0\}]$$

The output signal from the adder 214 is given by $$\cos(\omega_{IF}t) \times \cos(\omega_{LO}t + \theta_0) + \sin(\omega_{IF}t) \times \{-\sin(\omega_{LO}t + \theta_0)\} = \quad (13)$$
$$(1/2)[\cos\{(\omega_{IF} + \omega_{LO})t + \theta_0\} + \cos\{(\omega_{IF} - \omega_{LO})t - \theta_0\}] -$$
$$(1/2)[\cos\{(\omega_{IF} - \omega_{LO})t - \theta_0\} - \cos\{(\omega_{IF} + \omega_{LO})t + \theta_0\}] =$$
$$\cos\{(\omega_{IF} + \omega_{LO})t + \theta_0\}$$

In the output from the adder 214, a lower side band (frequency: $\omega_{IF}-\omega_{LO}$) is canceled out and an upper side band (frequency: $\omega_{IF}+\omega_{LO}=\omega_p$) microwave is output to the pump line 114. A DC (direct current) component is applied in addition to the microwave, to the pump line 114. Addition of the DC component to the microwave may be performed inside a refrigerator in which a superconducting quantum circuit (chip) is arranged (DC biased microwave may be inductively coupled to the SQUID of the JPO). The pump signal supplied to the pump line 114 may be an amplitude modulated signal rather than a frequency modulated signal as described above.

According to the present example embodiment, there is an advantage that a coupling strength can be adjusted with a simpler configuration compared with a configuration that uses a coupler with a coupling strength adjustable.

Figure 4A:
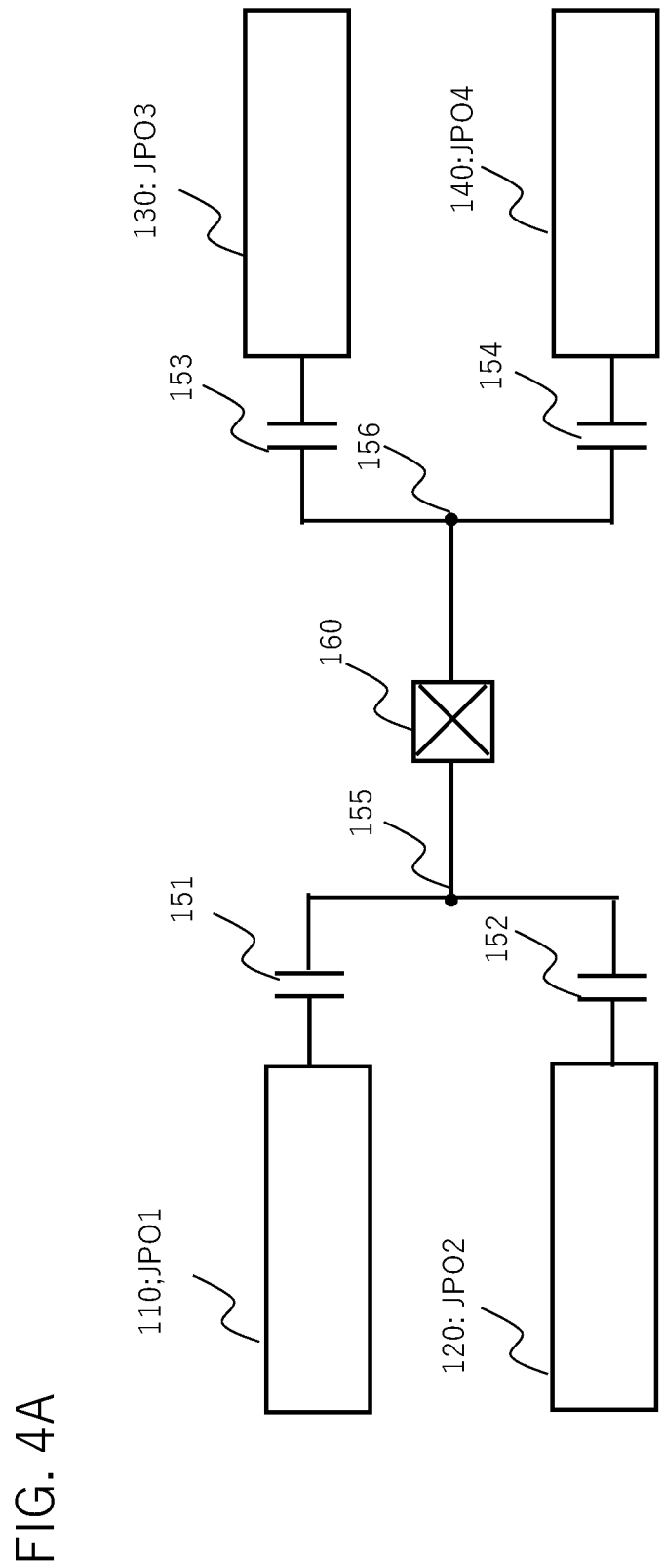
FIG. 4A is a diagram schematically illustrating an example of the example embodiment.

FIG. 4A illustrates another example embodiment of the present invention. In FIG. 4A, a first JPO 110, a second JPO 120, a third JPO 130, and a fourth JPO 140 are each assumed to include a SQUID, first and second waveguides, and a pump line that provides a magnetic flux penetrating through the SQUID.

The first JPO 110 and the second JPO 120 are connected to a node 155 via capacitors 151 and 152 (Alternate Current, AC, coupling), the third JPO 130 and the fourth JPO 140 are connected to a node 156 via capacitors 153 and 154 (AC coupling). The nodes 155 and 156 are connected via Josephson junction 160. The pump signals with frequencies $\omega_{p,1}$, $\omega_{p,2}$, $\omega_{p,3}$, $\omega_{p,4}$ and phases $\theta_{p,1}$, $\theta_{p,2}$, $\theta_{p,3}$, $\theta_{p,4}$ are supplied to the pump lines (not shown) of the first JPO 110, the second JPO 120, the third JPO 130, and the fourth JPO 140, respectively.

A Hamiltonian (quantized Hamiltonian) of a circuit in FIG. 4A can be expressed as a sum of a Hamiltonian $H_{JPO,k}$ of each JPO and an interaction Hamiltonian Hc, as follows.

$$H = \Sigma_{k=1}^{4} H_{JPO,k} + H_c \quad (14)$$

The Hamiltonian (quantized Hamiltonian) for each JPO is given as follows. Note that hbar is omitted $$H_{JPO,k} = \omega_{r,k} a_k^\dagger a_k - (K/2) a_k^{\dagger 2} a_k^2 + \varepsilon_p(t)[\exp\{-i(\omega_{p,k}(t)t/2)\}a_k^{\dagger 2} + \exp\{i(\omega_{p,k}(t)t/2)\}a_k^2] \quad (15)$$

where $a_k^\dagger$ and $a_k$ and are a creation operator and an annihilation operator for an oscillation mode across the kth JPO (k=1,2,3,4), $a_{r,k}$ is a resonance frequency of the kth JPO, K is a Kerr coefficient representing amplitude of Kerr-nonlinearity which JPO has, p $\varepsilon_p(t)$ is an amplitude of a parametric pump (two-photon pump), and $\omega_{p,k}(t)$ is an angular frequency of a parametric pump of k-th JPO.

The interaction Hamiltonian Hc (quantized Hamiltonian) is given by the following Equation (16).

$$H_c = \omega_c a_c^\dagger a_c + g_1(a_c^\dagger a_1 + a_1^\dagger a_c) + g_2(a_c^\dagger a_2 + a_2^\dagger a_c) - g_3(a_c^\dagger a_3 + a_3^\dagger a_c) - g_4(a_c^\dagger a_4 + a_4^\dagger a_c) - E_J\{\cos(\Phi/\Phi_0) + (1/2)(\Phi/\Phi_0)^2\} \quad (16)$$

where $a_c^\dagger$ and $a_c$ are a creation operator and an annihilation operator for a mode (junction mode) across the Josephson junction (coupling Josephson junction)160, $g_i$(i=1,2,3,4) is a magnitude of the coupling (rate at which energy is exchanged) between the $i^{th}$ JPO and the mode of the Josephson junction 160, $\Phi_0 = (h/2\pi)(2e)$ is a flux quantum, $\omega_c$ is a frequency of the junction mode, and $E_J$ is a Josephson energy of the Josephson junction 160 disposed at the center part of the circuit, which is proportional to a critical current value of the Josephson junction 160.

In the Equation (16), $\Phi$ is given by $$\Phi = \Phi_c(a_c^\dagger + a_c) \quad (17).$$

where $\Phi_c$ is a standard deviation of a zero-point magnetic flux fluctuation for the Josephson junction 160.

In FIG. 4A, the first to fourth JPOs 110-140 are nonlinear resonators, each including a SQUID as a nonlinear inductor, as with the first JPO 110 and the second JPO 120 described with reference to FIG. 1. The Josephson junction 160 disposed in a center part is a nonlinear inductor and can be regarded as a nonlinear resonator. Therefore, the configuration illustrated in FIG. 4A can be regarded as a circuit in which five nonlinear resonators are connected. A four-body coupling in the center of the circuit may be denoted as a resonator for coupling. A resonance mode of the Josephson junction 160 in the center part is far detuned from JPOs and is not driven externally, so that we have $$\langle a_c \rangle = \langle a_c^\dagger a_c \rangle = 0.$$

The four JPOs 110-140 in FIG. 4A are also termed as "plaquette" according to NPL 2.

In interaction of the Equation (17), under the condition $$\omega_{p,k} \neq \omega_{p,m}, \omega_{p,1} + \omega_{p,2} = \omega_{p,3} + \omega_{p,4} \quad (18),$$

if an oscillation term such as, for example, $$\omega_{p,1} - \omega_{p,2} \quad (19),$$

due to a frequency difference of the pump signal of JPO is negligible, the plaquette Hamiltonian is given by the following Equation (20)

$$H_{plaquette} \approx \sum_{k=1}^{4}\left\{H_{JPA,k} - \frac{g_k^2}{\Delta_k}a_k^\dagger a_k\right\} - \quad (20)$$

$$E_J \frac{\Phi_c^4}{\Phi_0^4} \frac{g_1 g_2 g_4 g_4}{\Delta_1 \Delta_2 \Delta_4 \Delta_4}\left(a_1^\dagger a_2^\dagger a_3 a_4 + h.c.\right) - E_J \frac{\Phi_c^4}{\Phi_0^4} \sum_{k \neq m=1}^{4} \frac{g_k^2 g_m^2}{\Delta_k^2 \Delta_m^2} a_k^\dagger a_k a_m^\dagger a_m$$

In the Equation (20), the second part $(g_k^2/\Delta_k)a_k^\dagger a_k$ of the first term of the right side results in a frequency shift of a JPO mode due to off-resonant coupling with the Josephson junction 160.

In the Equation (20), the second term of the right side is a term of a four-body coupling (interaction) among the first to fourth JPOs. From the second term of the Equation (20), a coupling strength (coefficient) C of the four-body interaction can be given in terms of circuit parameters as:

$$C = E_J \frac{\Phi_c^4}{\Phi_0^4} \frac{g_1 g_2 g_4 g_4}{\Delta_1 \Delta_2 \Delta_4 \Delta_4} \quad (21)$$

In the Equation (20), the last term gives rise to a cross-Kerr interaction between the JPOs.

In the Equation (20), $\Delta_k$ is a difference (detuning) between a mode frequency $\omega_{r,k}$ of the kth JPO and a mode frequency (resonance frequency) $\omega_c$, where the mode frequency $\omega_c$ is specified by a capacitance and an inductance which the Josephson junction 160 has.

$$\Delta_k = \omega_c - \omega_{r,k} \quad (22)$$

Thus, in FIG. 4A, a magnitude (strength) of the four-body interaction can be varied by varying at least one of resonance frequencies of the first through fourth JPOs 110-140 or a mode frequency of the Josephson junction 160.

In addition, since the pump signals with frequencies $\omega_{p,1}$, $\omega_{p,2}$, $\omega_{p,3}$, $\omega_{p,4}$ and phases $\theta_{p,1}$, $\theta_{p,2}$, $\theta_{p,3}$, $\theta_{p,4}$ are supplied to the first through the pump lines of the fourth JPO 110-140, respectively, the second term of right side of the Equation (20) is given as:

$$E_J \frac{\Phi_c^4}{\Phi_0^4} \frac{g_1 g_2 g_4 g_4}{\Delta_1 \Delta_2 \Delta_4 \Delta_4}\left(\left[\exp\left\{-\frac{i(\theta_{p,3} + \theta_{p,4} - \theta_{p,1} - \theta_{p,2})}{2}\right\}\right]\left(a_1^\dagger a_2^\dagger a_3 a_4 + h.c.\right)\right) \quad (23)$$

Therefore, an effective coupling strength of the four-body interaction can be adjusted by adjusting a relative phase of at least one JPO among four JPO 110 through JPO 140.

Figure 4B:
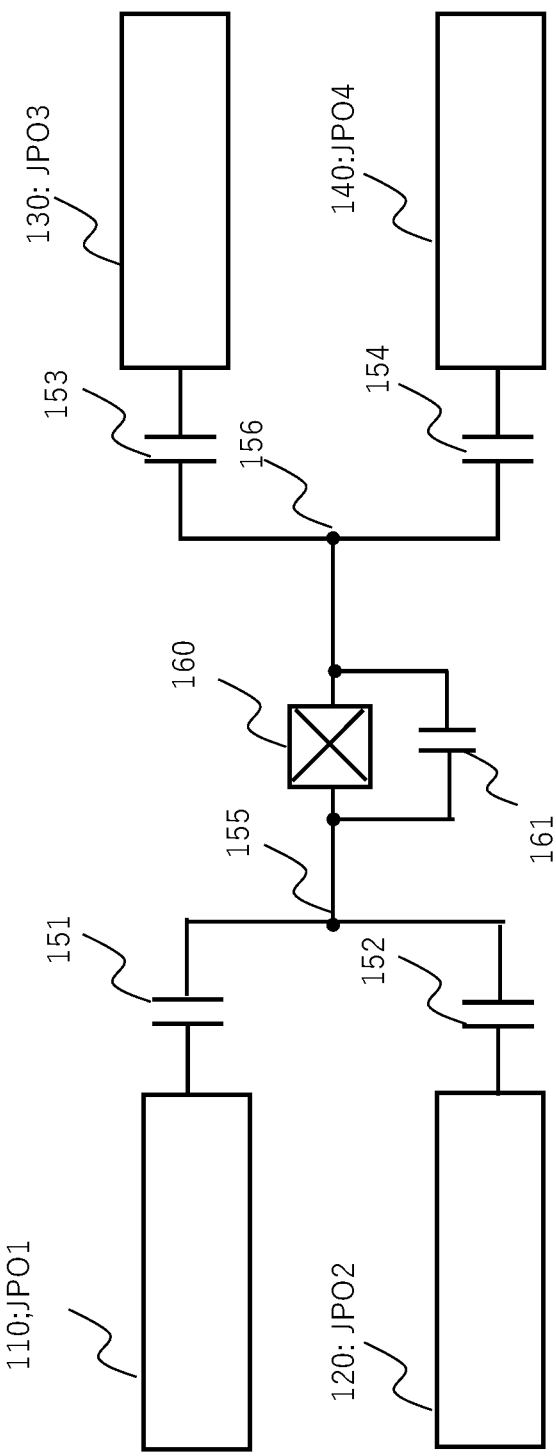
FIG. 4B is a diagram schematically illustrating an example of a variation of the example embodiment.

FIG. 4B illustrates a variation of the configuration illustrated in FIG. 4A. Referring to FIG. 4B, a capacitor 161 is shunt-connected (connected in parallel) between both ends of the Josephson junction 160 to realize a coupler that is resistant to charge noise.

In the circuits illustrated in FIG. 4A and FIG. 4B, the Josephson junction 160 acts as an inductor. A magnitude of inductance $L_J$ is expressed using a critical current value $I_c$ of the Josephson junction 160 as $$L_J = \Phi_0/(2\pi I_c) \tag{24}$$

The critical current value $I_c$ is determined by the Josephson junction (such as material properties, area (junction size), and thickness of two superconductors and an insulating film disposed therebetween).

Figure 5A:
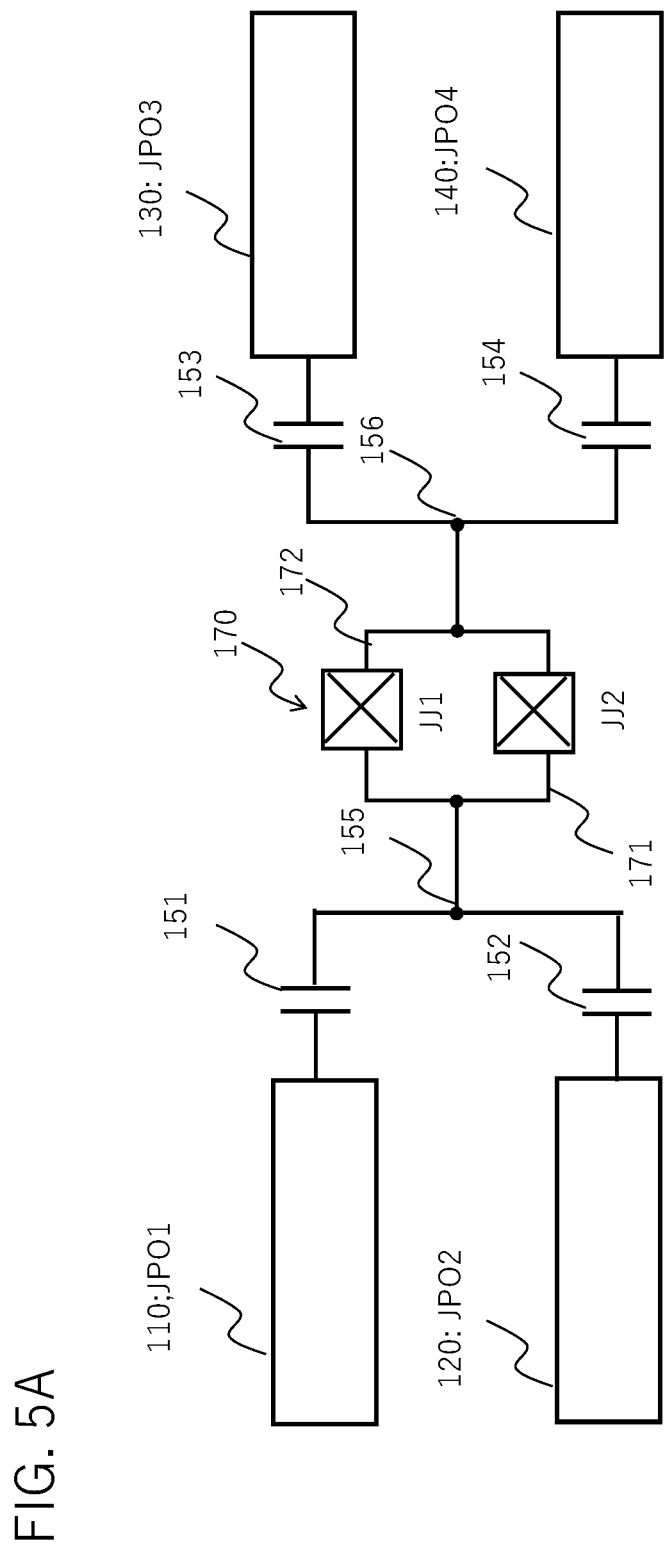
FIG. 5A is a diagram schematically illustrating another example of a variation of the example embodiment.

FIG. 5A illustrates a configuration in which the Josephson junction 160 in the center part in FIG. 4A is replaced by a SQUID 170, in which a superconducting line 171, a first Josephson Junction (JJ1), a superconducting line 172, and a second Josephson Junction (JJ2) are connected in a loop. In this configuration, a resonance frequency $\omega_c$, of a coupler can be varied by using the SQUID 170 instead of the Josephson junction (160 in FIG. 4A). Therefore, detuning between the SQUID 170 and the four JPOs can be varied to adjust the maximum and minimum values of the four-body interaction which are variable depending on phases of four pump signals.

When the magnetic flux passing through the loop of the SQUID is $\Phi_{ext}$ the critical current value $I_c^{eff}$ of an entire SQUID is given by $$I_c^{eff} = 2I_c|\cos(\pi\Phi_{ext}/\Phi_0)| \tag{25}$$

The SQUID is an inductor with an inductance varied by a magnetic flux passing through the SQUID loop. The magnetic flux passing through the SQUID loop can be varied relatively easily by applying an external current. Therefore, a resonance frequency $\omega_c$ of the coupler can be made variable by replacing the Josephson junction 160 in the center part of the circuit with the SQUID 170. This varies values of $\Delta_k$ and $E_J$, resulting in a change of the magnitude of the four-body interaction. Note that when the Josephson junction 160 in the center part is replaced with the SQUID 170, a resonance frequency of the coupler may vary due to unintended magnetic flux fluctuation (flux noise), etc.

In FIG. 5A, the four JPOs 110-140 are coupled by four-body interaction, when the respective resonance frequencies of the first to fourth JPOs 110-140 satisfy the following conditions for four-body interaction:

$$\omega_{p,k} \neq \omega_{p,m}(k \neq m=1,\ldots,4), \omega_{p,1}+\omega_{p,2}=\omega_{p,3}+\omega_{p,4} \tag{26}$$

In this case, a term of the four-body interaction in the Hamiltonian, is given by $$E_J \frac{\Phi_c^4}{\Phi_0^4} \frac{g_1 g_2 g_4 g_4}{\Delta_1 \Delta_2 \Delta_4 \Delta_4} [\exp\{-i(\theta_{p,3}+\theta_{p,4}-\theta_{p,1}-\theta_{p,2})/2\}](a_1^\dagger a_2^\dagger a_3 a_4 + h.c.) \tag{27}$$

Here, the expression (23) is cited again for convenience of explanation.

The following considers an expected value of an energy of the Expression (27). When varying one of the phases of pump signals for parametric oscillation supplied to the first to fourth JPOs 110-140, respectively, a value of $$\exp\{-i(\theta_{p,3}+\theta_{p,4}-\theta_{p,1}-\theta_{p,2})/2\} \tag{28}$$

varies.

Maximum and minimum value of a real part of $\exp\{-i(\theta_{p,3}+\theta_{p,4}-\theta_{p,1}-\theta_{p,2})/2\}$ in the Expression (28) are +1 and −1, respectively.

Therefore, a range that is able to be varied only by varying the phase of the pump signals supplied for parametric oscillation to the first to fourth JPOs 110-140, respectively, is given by $$\pm E_J \frac{\Phi_c^4}{\Phi_0^4} \frac{g_1 g_2 g_4 g_4}{\Delta_1 \Delta_2 \Delta_4 \Delta_4} \tag{29}$$

When varying the magnetic flux $\Phi_{ext}$ that passes through the loop of the SQUID 170, values the detuning $\Delta_k$ and the Josephson energy $E_J$ in the Equation (29) are varied, respectively, as a result of which a value of $$C = E_J \frac{\Phi_c^4}{\Phi_0^4} \frac{g_1 g_2 g_4 g_4}{\Delta_1 \Delta_2 \Delta_4 \Delta_4}$$

in the Equation (21) varies.

Thus, it is possible to adjust maximum and the minimum values of the four-body interaction, which can be varied by the phases of the pump signals supplied for parametric oscillation to the first to fourth JPOs 110-140, respectively.

Note that when the resonance frequency $\omega_c$ of the SQUID 170 is varied, not only detuning $\Delta_k$ but also the Josephson energy $E_J$ is varies.

As described above, in example illustrated in FIG. 5A, by replacing the Josephson junction 160 in FIG. 4A with the SQUID 170, the maximum and minimum values of the four-body interaction $$\pm E_J \frac{\Phi_c^4}{\Phi_0^4} \frac{g_1 g_2 g_4 g_4}{\Delta_1 \Delta_2 \Delta_4 \Delta_4} \pm \tag{30}$$

can be varied.

Dependency of the four-body interaction to the resonance frequency $\omega_c$ of the SQUID 170 is complicated. Therefore, in actual experiments, basically without changing resonance frequency $\omega_c$ of the SQUID 170 in FIG. 5A, the respective resonance frequencies $\omega_{r,k}$ (k=1~4) of the first to fourth JPOs 110-140 may be adjusted so that $$C = E_J \frac{\Phi_c^4}{\Phi_0^4} \frac{g_1 g_2 g_4 g_4}{\Delta_1 \Delta_2 \Delta_4 \Delta_4}$$

becomes large as compared to a required magnitude (strength) of the four-body interaction, and then, the value of the four-body interaction may be fine-tuned by adjusting the phases of the pump signals supplied for parametric oscillation to the first to fourth JPOs 110-140, respectively.

As described above, according to the present example embodiment, an effective coupling strength can be adjusted by adjusting a relative phase of pump signals supplied to the first to fourth JPOs 110-140 for parametric oscillation. When the resonance frequencies $\omega_{p,1}$, $\omega_{p,2}$, $\omega_{p,3}$, $\omega_{p,4}$ of the first to fourth JPOs 110-140 satisfy $$\omega_{p,1}+\omega_{p,2}=\omega_{p,3}+\omega_{p,4} \tag{31},$$

a value of $$\theta_{p,1} + \theta_{p,2} + \theta_{p,3} - \theta_{p,4} \quad (32)$$

is adjusted for the phases of pump signals.

Therefore, the effective coupling strength can be adjusted by adjusting a relative phase at least in one JPO among four JPOs 110-140 in FIG. 5A. For example, four-body interaction term can be adjusted by adjusting a relative phase of phase $\theta_{p,3}$ of the pump signal in JPO 130 to phase $\theta_{p,1}$ of the pump signal in JPO 110, while fixing the values of $\theta_{p,1}$, $\theta_{p,2}$, $\theta_{p,3}$, and $\theta_{p,4}$.

Figure 5B:
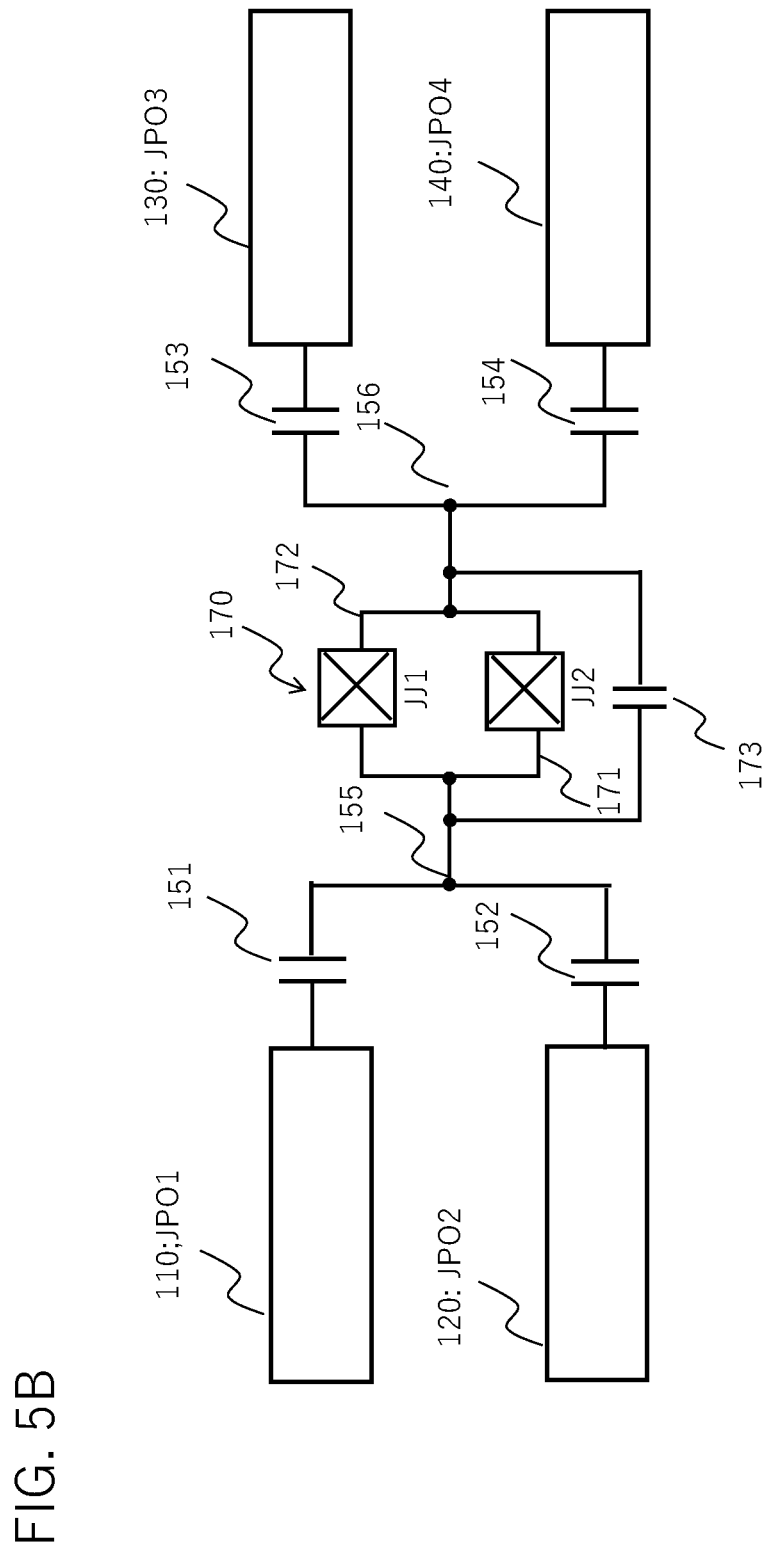
FIG. 5B is a diagram schematically illustrating another example of a variation of the example embodiment.

FIG. 5B illustrates a variation of the configuration illustrated in FIG. 5A. Referring to FIG. 5B, a capacitor 173 is shunt-connected between both ends of the SQUID 170, which is a coupler of the four-body interaction to realize a coupler that is resistant to charge noise.

Figure 6:
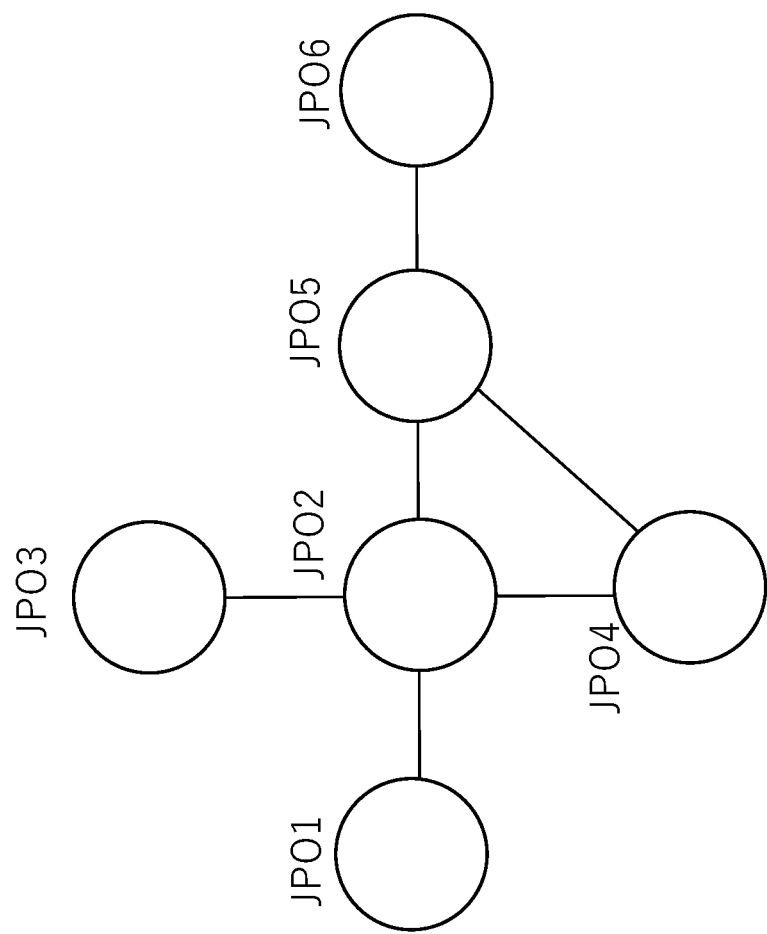
FIG. 6 is a diagram schematically illustrating an example of a network configuration of the example embodiment.

In still another example embodiment, a JPO network is configured using two-body interaction which is described with reference to FIG. 3A. In the JPO network configured such that two-body interaction coupling portions do not form a loop, signs and magnitudes of all two-body interaction can be adjusted by adjusting a phase of pump signals (relative phase). When two-body interaction coupling portions in the JPO network form a loop (JPO2-JPO4-JPO5) as illustrated in FIG. 6, an adjusting range of signs and magnitudes of all the two-body interaction is limited. The reason is that phases of some pump signals cannot be freely determined.

Figure 8A:
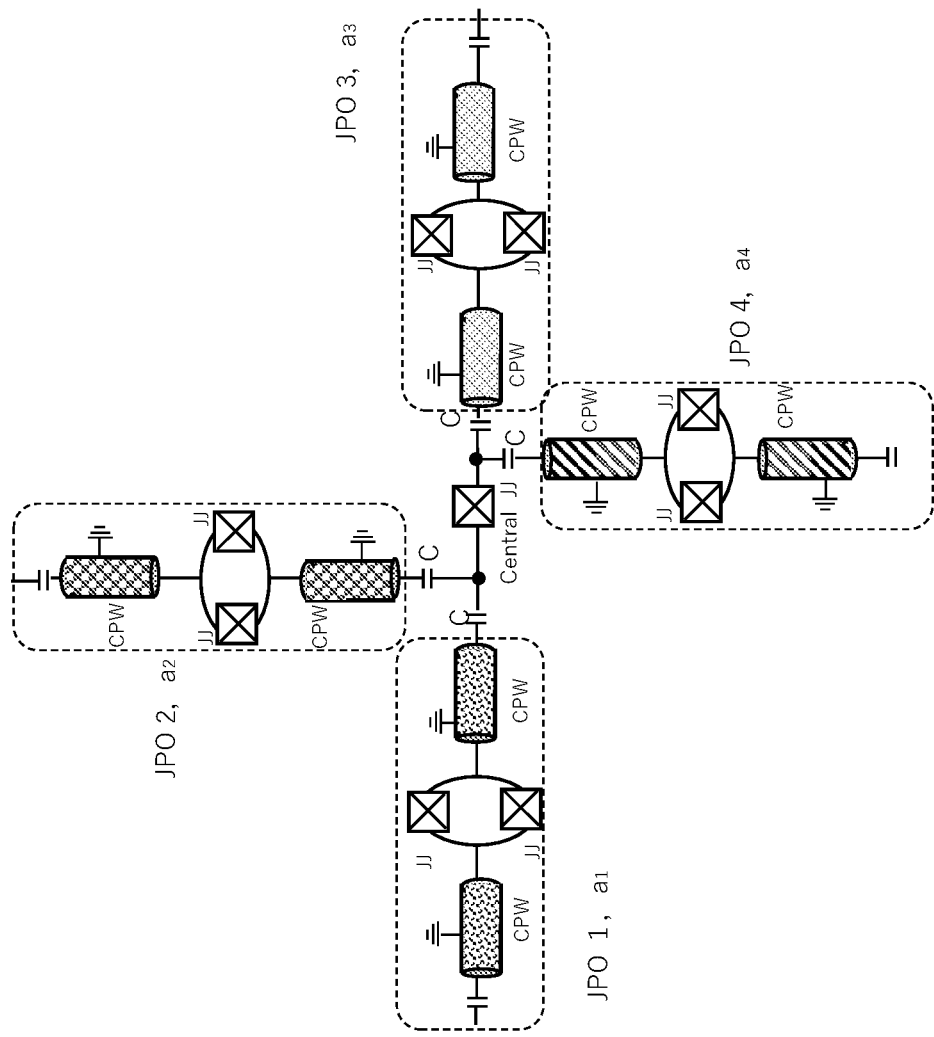
FIG. 8A is a diagram illustrating an example of a related art.
Figure 8B:
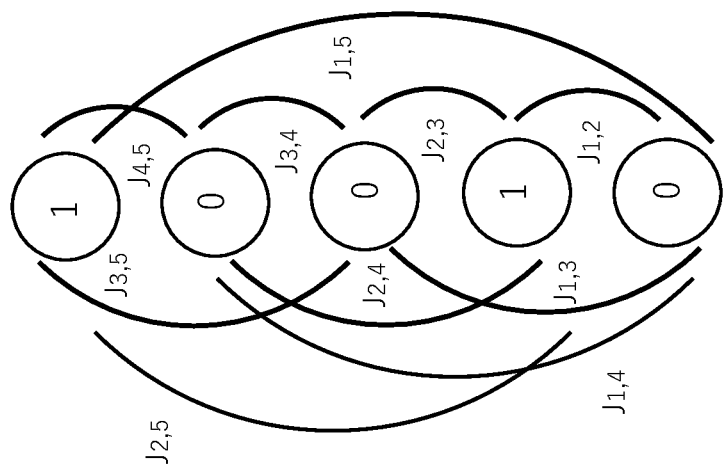
FIG. 8B is a diagram illustrating an example of a related art.
Figure 8C:
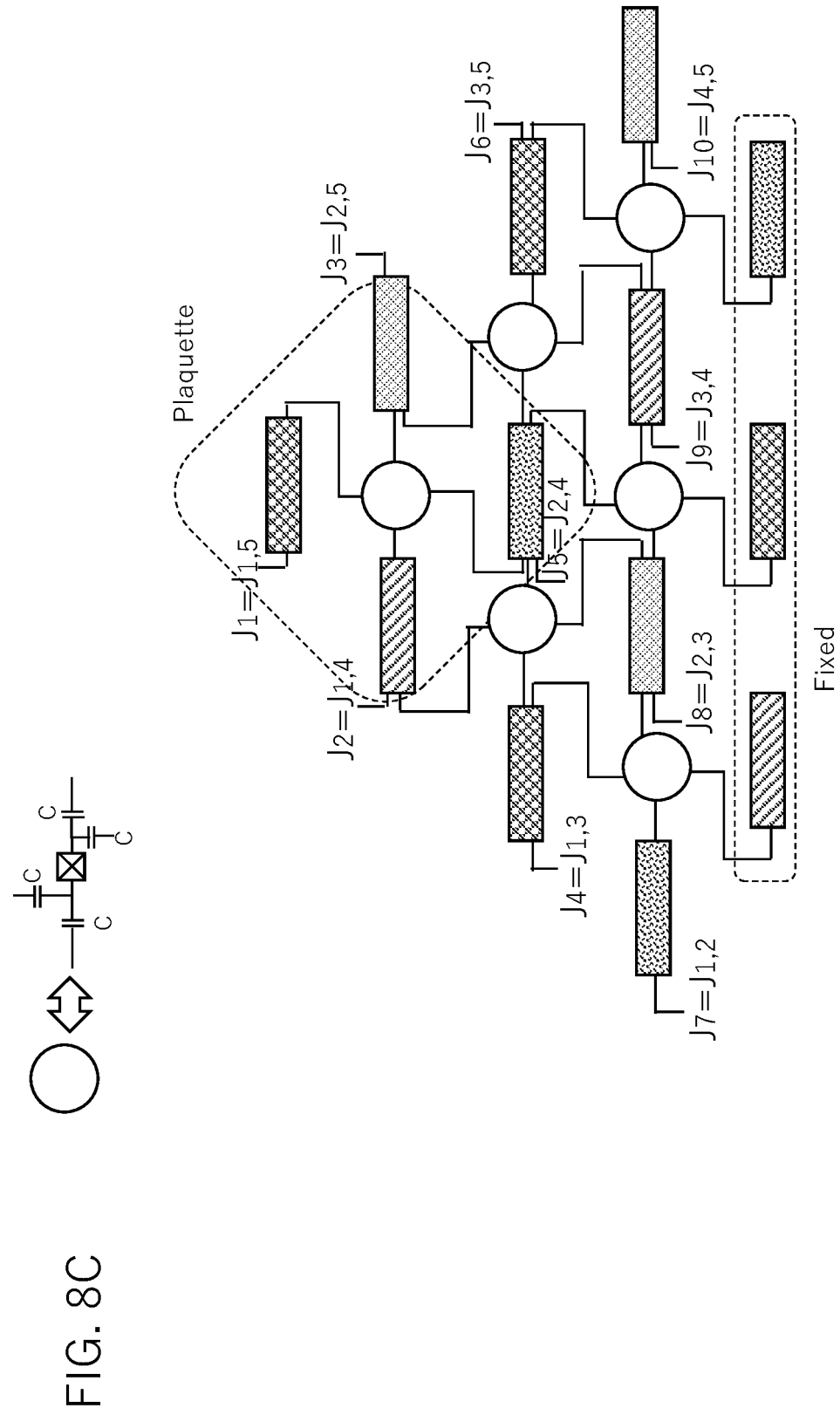
FIG. 8C is a diagram illustrating an example of a related art.

In the LHZ (Lechner, Hauke, Zoller) scheme, which planarly couples four-body interaction couplers described with reference to FIG. 4A and FIG. 5A, there is no loop in a JPO network that limits a degree of freedom, because they are coupled loosely, as illustrated in FIG. 8C. Any combination of coupling strengths can be realized without restriction.

In two-body interaction coupling and/or four-body interaction coupling between JPOs, a polarity (positive and negative) and a magnitude of a coupling strength can be adjusted by adjusting (varying) a relative phase of the pump signals supplied to JPOs for parametric oscillation.

Note that same effect as above can be obtained by using lumped constant type JPO described with reference to FIG. 2A to FIG. 2D, instead of the distributed element JPO.

In the above-described example embodiments, a two-body and/or four-body coupling portion (capacitors, Josephson junctions) that does not have an ability to adjust a coupling strength is described, however, the present disclosure is also applicable to a coupling portion whose coupling strength is able to be variably adjusted. For example, the technique (adjusting a strength of the four-body interaction by the phase of pump signals for parametric oscillation of JPOs) of the present disclosure can be applied to a variable four-body coupling portion (JRM) described with reference to FIG. 7.

In this case, in order to realize the four-body interaction, when the combination (or relation) of the resonance frequencies of the JPOs 1, 2, 3, and 4, and a frequency $\omega_d$ of the drive signals inputted from capacitors Cx, Cy is, for example, given by $$\omega_d = \omega_{p,1} + \omega_{p,2} + \omega_{p,3} - \omega_{p,4} \quad (33)$$

Hamiltonian with respect to the drive signal of $$2\omega_z\sqrt{n}\cos(\omega_d t) \quad (34)$$

is given by a following Equation (35).

$$H_{plaquette} \approx \sum_{k=1}^{4} \left\{ H_{JPA,k} - \frac{(g_k^x)^2}{\Delta_k^x} a_k^\dagger a_k \right\} - C_{jrn}(a_1^\dagger a_2^\dagger a_3^\dagger a_4 + h.c.) \quad (35)$$

where $$C_{jrn} = E_j \sqrt{n} \frac{\Phi_x^4 \Phi_z}{4\Phi_0^5} \frac{g_1 g_2 g_4 g_4}{\Delta_1 \Delta_2 \Delta_4 \Delta_4} \quad (36)$$

The second term on the right side of Equation (35) is the four-body interaction term. In this second term, an effect caused by phases of the pump signals supplied to the first to fourth JPO1-JPO4, respectively, is given explicitly by the following Expression (37).

$$E_j \sqrt{n} \frac{\Phi_x^4 \Phi_z}{4\Phi_0^5} \quad (37)$$

$$\frac{g_1 g_2 g_4 g_4}{\Delta_1 \Delta_2 \Delta_4 \Delta_4} [\exp\{-i(\theta_{p,3} + \theta_{p,4} - \theta_{p,1} - \theta_{p,2})/2\}](a_1^\dagger a_2^\dagger a_3^\dagger a_4 + h.c.)$$

Figure 7:
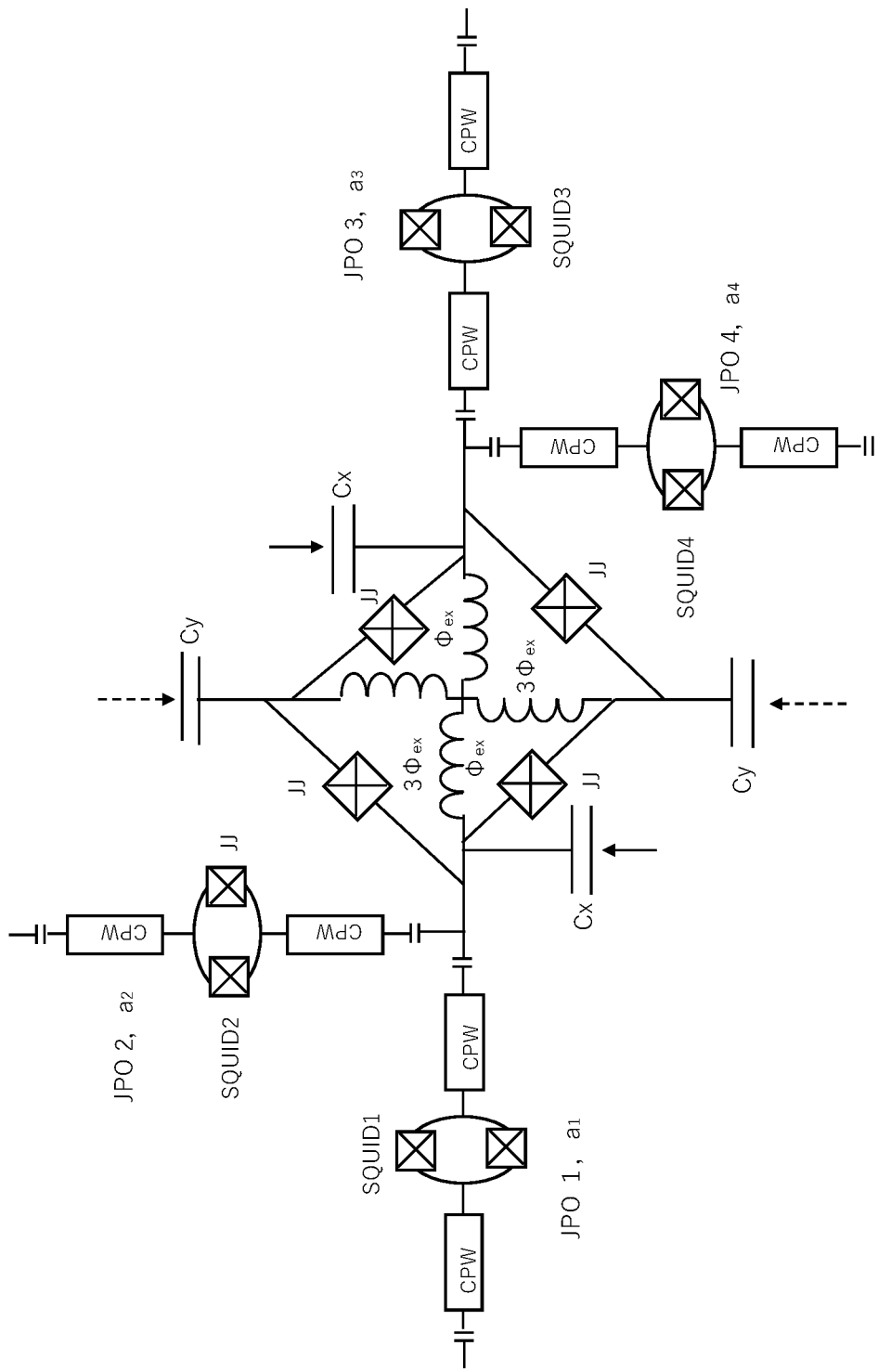
FIG. 7 is a diagram illustrating an example of a related art.

Therefore, even in the circuit illustrated in FIG. 7, the effective coupling strength of the four JPOs has dependency in the form of $$\exp\{-i(\theta_{p,1} + \theta_{p,2} + \theta_{p,3} - \theta_{p,4})/2\} \quad (38)$$

with respect to the phases $\theta_{p,1}$, $\theta_{p,2}$, $\theta_{p,3}$, and $\theta_{p,4}$ of the pump signals supplied to the first to fourth JPOs 1-4, respectively. Even in the configuration with a shunted-type JRM as illustrated in FIG. 7, a sign (positive and negative) and magnitude of the coupling strength of the four-body interaction is enabled to be adjusted by adjusting (varying) a relative phase of the pump signals supplied to JPOs 1-4 for parametric oscillation.

Even in a JPO network in which a plurality of JPOs are planarly coupled by a four-body interaction coupling portions, signs and magnitudes of each four-body interaction can be adjusted by adjusting the phase of the pump signals supplied to the JPOs. For example, a JPO network can be used to configure a quantum annealer, as illustrated in FIG. 8C.

Note that a superconducting quantum circuit according to each of the above-mentioned example embodiments may be implemented by, for example, lines (wirings) of a superconducting material formed on a substrate. In this case, while silicon may be used as a material for the substrate, any other electric materials such as sapphire or compound semiconductor materials (Group IV, III-V, II-VI) may be used. The substrate is preferably monocrystalline, but may also be polycrystalline or amorphous. While Nb (niobium) or Al (aluminum) may be used as a material of the superconducting line, the material is not limited to them and any other metal which is in a superconducting state when it is cooled to an extremely low temperature (cryogenic temperature), such as niobium nitride (NbN), indium (In), lead (Pb), tin (Sn), rhenium (Re), palladium (Pd), titanium (Ti), molybdenum (Mo), tantalum (Ta), tantalum nitride and alloys containing at least any one of those, may be used. In order to achieve a superconducting state, a superconducting quantum circuit is used in a temperature environment such as at 10 mK (milli-Kelvin) achieved by a cryogenic refrigerating machine.

Each disclosure of PTL 1 and NPLs 1 and 2 cited above is incorporated herein in its entirety by reference thereto. It is to be noted that it is possible to modify or adjust the example embodiments or examples within the whole disclosure of the present invention (including the Claims) and based on the basic technical concept thereof. Further, it is possible to variously combine or select a wide variety of the disclosed elements (including the individual elements of the individual claims, the individual elements of the individual examples and the individual elements of the individual figures) within the scope of the Claims of the present invention. That is, it is self-explanatory that the present invention includes any types of variations and modifications to be done by a skilled person according to the whole disclosure including the Claims, and the technical concept of the present invention.

APPENDIX

For reference, the correspondence between the equation numbers in the present disclosure and those in Supplementary Note 6, 8 (Note 6, 8) of NPL 2 is provided.

| Specification | (14) | (15) | (16) | (20) | (35) | (36) |
|---|---|---|---|---|---|---|
| NPL 2 | Note 6 (18) | Note 6 (17) | Note 6 (19) | Note 6 (23) | Note 8 (30) | Note 8 (31) |

What is claimed is:

1. A superconducting quantum circuit apparatus, comprising:
    two or four Josephson parametric oscillators,
        each Josephson parametric oscillator including:
        a SQUID (Superconducting Quantum Interference Device) including a first superconducting line, a first Josephson junction, a second superconducting line, and a second Josephson junction connected in a loop; and
        a pump line, with a pump signal supplied thereto, providing a magnetic flux penetrating through the loop of the SQUID,
    the two or four Josephson parametric oscillators each oscillating parametrically in response to the pump signal supplied to the pump line thereof;
    a coupler to couple the two or four Josephson parametric oscillators; and
    a phase adjuster that varies a relative phase between or among pump signals supplied respectively for parametric oscillation to the pump lines of the two or four Josephson parametric oscillators, to vary a strength of a two-body or four-body interaction between or among the two or four Josephson parametric oscillators.

2. The superconducting quantum circuit apparatus according to claim 1, wherein the coupler coupling the two Josephson parametric oscillators includes a capacitor.

3. The superconducting quantum circuit apparatus according to claim 1, wherein the coupler coupling the four Josephson parametric oscillators includes a Josephson junction.

4. The superconducting quantum circuit apparatus according to claim 1, wherein the coupler coupling the four Josephson parametric oscillators includes a SQUID.

5. The superconducting quantum circuit apparatus according to claim 3, wherein the Josephson junction included in the coupler has one end capacitively connected to a first Josephson parametric oscillator and a second Josephson parametric oscillator and an other end capacitively connected to a third Josephson parametric oscillator and a fourth Josephson parametric oscillator.

6. The superconducting quantum circuit apparatus according to claim 4, wherein the SQUID included in the coupler has one end of capacitively connected to a first Josephson parametric oscillator and a second Josephson parametric oscillator and an other end capacitively connected to a third Josephson parametric oscillator and a fourth Josephson parametric oscillator.

7. The superconducting quantum circuit apparatus according to claim 3, wherein the coupler further includes
    a capacitor shunt-connected to the Josephson junction.

8. The superconducting quantum circuit apparatus according to claim 4, wherein the coupler further includes
    a capacitor shunt-connected to the SQUID.

9. The superconducting quantum circuit apparatus according to claim 1, wherein the phase adjuster varies at least a phase of one pump signal out of the pump signals supplied respectively to the pump lines of the two Josephson parametric oscillators to vary the relative phase to vary the strength of the two-body interaction between the two Josephson parametric oscillators.

10. The superconducting quantum circuit apparatus according to claim 1, wherein the phase adjuster varies at least a phase of one pump signal among the pump signals supplied respectively to the pump lines of the four Josephson parametric oscillators to vary the relative phase to vary the strength of the four-body interaction among the four Josephson parametric oscillators.

11. The superconducting quantum circuit apparatus according to claim 1, wherein the phase adjuster includes
    at least a phase shifter provided on a transmission line between a signal source of the pump signal and the pump line to shift a phase of the pump signal to be supplied to the pump line.

12. The superconducting quantum circuit apparatus according to claim 1, wherein the phase adjuster includes
    a quadrature modulator including:
        a first and second mixers;
        a local oscillator outputting a local oscillation signal with a preset initial phase;
        a phase shifter shifting a phase of the local oscillation signal by $\pi/2$, and an adder,
        the first mixer receiving an in-phase signal and the local oscillation signal to output a multiplication result of the signals received,
        the second mixer receiving a quadrature signal and an output signal from the phase shifter to output a multiplication result of the signals received,
        the adder adding signals output from the first mixer and the second mixer to supply a resulting signal to the pump line.

13. The superconducting quantum circuit apparatus according to claim 1, wherein, as the pump signal, a dc-biased microwave is supplied to the pump line.

14. The superconducting quantum circuit apparatus according to claim 1, wherein the phase adjuster, by varying the relative phase between or among the pump signals supplied to the two or four Josephson parametric oscillators to change a sign and/or a magnitude of a coupling strength of the two-body or four-body interaction.

15. The superconducting quantum circuit apparatus according to claim 1, wherein the phase adjuster, by varying the relative phase between or among pump signals supplied respectively for parametric oscillation to the pump lines of the two or four Josephson parametric oscillators, performs a fine-tuning of the strength of the two body or four body interaction, the strength adjusted in advance to have a preset magnitude.

16. The superconducting quantum circuit apparatus according to claim 1, wherein the coupler comprises
a ring modulator including
a first node connected to a first Josephson parametric oscillator and a second Josephson parametric oscillator;
a second node connected to a third Josephson parametric oscillator and a fourth Josephson parametric oscillator;
a first to fourth capacitors;
first and second pairs of Josephson junction connected between the first node and the second node in parallel, each pair of the Josephson junctions connected in series,
wherein a first drive signal is applied to the first node and the second node via the first capacitor and the second capacitor, and
a second drive signal is applied to a third node and a fourth node via the third capacitor and the fourth capacitor, the second drive signal being a drive signal of equal strength and opposite phase with respect to the first drive signal,
the third node being a connection point of the serially connected Josephson junctions of the first pair,
the fourth node being a connection point of the serially connected Josephson junctions of the second pair.

17. A control method for a superconducting quantum circuit apparatus, wherein the superconducting quantum circuit comprises:
two or four Josephson parametric oscillators,
each Josephson parametric oscillator including:
a SQUID (Superconducting Quantum Interference Device) including a first superconducting line, a first Josephson junction, a second superconducting line, and a second Josephson junction connected in a loop; and
a pump line, with a pump signal supplied thereto, providing a magnetic flux penetrating through the loop of the SQUID,
the two or four Josephson parametric oscillators each oscillating parametrically in response to the pump signal supplied to the pump line thereof; and
a coupler to couple the two or four Josephson parametric oscillators, the control method comprising:
adjusting a relative phase between or among the pump signals supplied for parametric oscillation to the two or four Josephson parametric oscillators to adjust a strength of a two-body or four-body interaction.

18. The control method according to claim 17, comprising before the adjusting the relative phase,
adjusting resonance frequencies of each Josephson parametric oscillator so that a strength of two-body or four-body interaction becomes a preset magnitude, without changing a resonance frequency of the coupler.

* * * * *